United States Patent
Li et al.

(10) Patent No.: US 11,133,074 B1
(45) Date of Patent: Sep. 28, 2021

(54) INSTANT AND PERMANENT SELF-DESTRUCTION METHOD IN 3D NAND FOR DATA SECURITY PURPOSE

(71) Applicant: Western Digital Technologies, Inc., San Jose, CA (US)

(72) Inventors: Liang Li, Shanghai (CN); Weihao Wang, Shanghai (CN); Xiaohua Liu, Shanghai (CN); David Joaquin Reed, Penang (MY)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 16/984,478

(22) Filed: Aug. 4, 2020

(30) Foreign Application Priority Data

Jul. 17, 2020 (CN) .......................... 202010692333.0

(51) Int. Cl.
*G11C 16/34* (2006.01)
*G11C 16/30* (2006.01)
*G11C 16/04* (2006.01)
*G11C 16/16* (2006.01)

(52) U.S. Cl.
CPC ...... *G11C 16/3404* (2013.01); *G11C 16/0433* (2013.01); *G11C 16/16* (2013.01); *G11C 16/30* (2013.01); *G11C 16/3472* (2013.01)

(58) Field of Classification Search
CPC . G11C 16/3404; G11C 16/0433; G11C 16/16; G11C 16/30; G11C 16/3472
See application file for complete search history.

(56) References Cited

U.S. PATENT DOCUMENTS

| | | | |
|---|---|---|---|
| 8,861,282 B2* | 10/2014 | Dutta | G11C 16/0483 365/185.29 |
| 8,867,271 B2* | 10/2014 | Li | G11C 16/0483 365/185.09 |
| 9,146,882 B2 | 9/2015 | Franceschini et al. | |
| 9,343,159 B2 | 5/2016 | Dong et al. | |
| 9,396,358 B1 | 7/2016 | Yap | |
| 9,418,751 B1* | 8/2016 | Dutta | G11C 16/10 |
| 9,984,760 B1 | 5/2018 | Zhang et al. | |
| 10,141,060 B1* | 11/2018 | Iwai | G11C 16/16 |
| 10,482,981 B2* | 11/2019 | Lu | G11C 16/30 |
| 10,528,769 B2 | 1/2020 | Abnett | |
| 2012/0151121 A1 | 6/2012 | Braga | |
| 2017/0084345 A1* | 3/2017 | Yang | G11C 16/34 |

* cited by examiner

*Primary Examiner* — Vanthu T Nguyen
(74) *Attorney, Agent, or Firm* — Vierra Magen Marcus LLP

(57) ABSTRACT

Apparatuses and techniques are described for performing an operation which irreversibly prevents access to a set of memory cells. The operation provides a strong erase bias for select gate transistors of NAND strings. The erase bias induces a phenomenon in the select gate transistors which permanently increases their threshold voltages. This prevents access to the memory cells such as for program or read operations. The operation can involve one or more erase-verify iterations. In each erase-verify iteration, an erase bias is applied to the select gate transistors such as by charging up the channels of the NAND strings and holding a control gate voltage of the select gate transistors at a relatively low level, thereby causing a relatively high channel-to-control gate voltage.

17 Claims, 15 Drawing Sheets

Fig. 1A
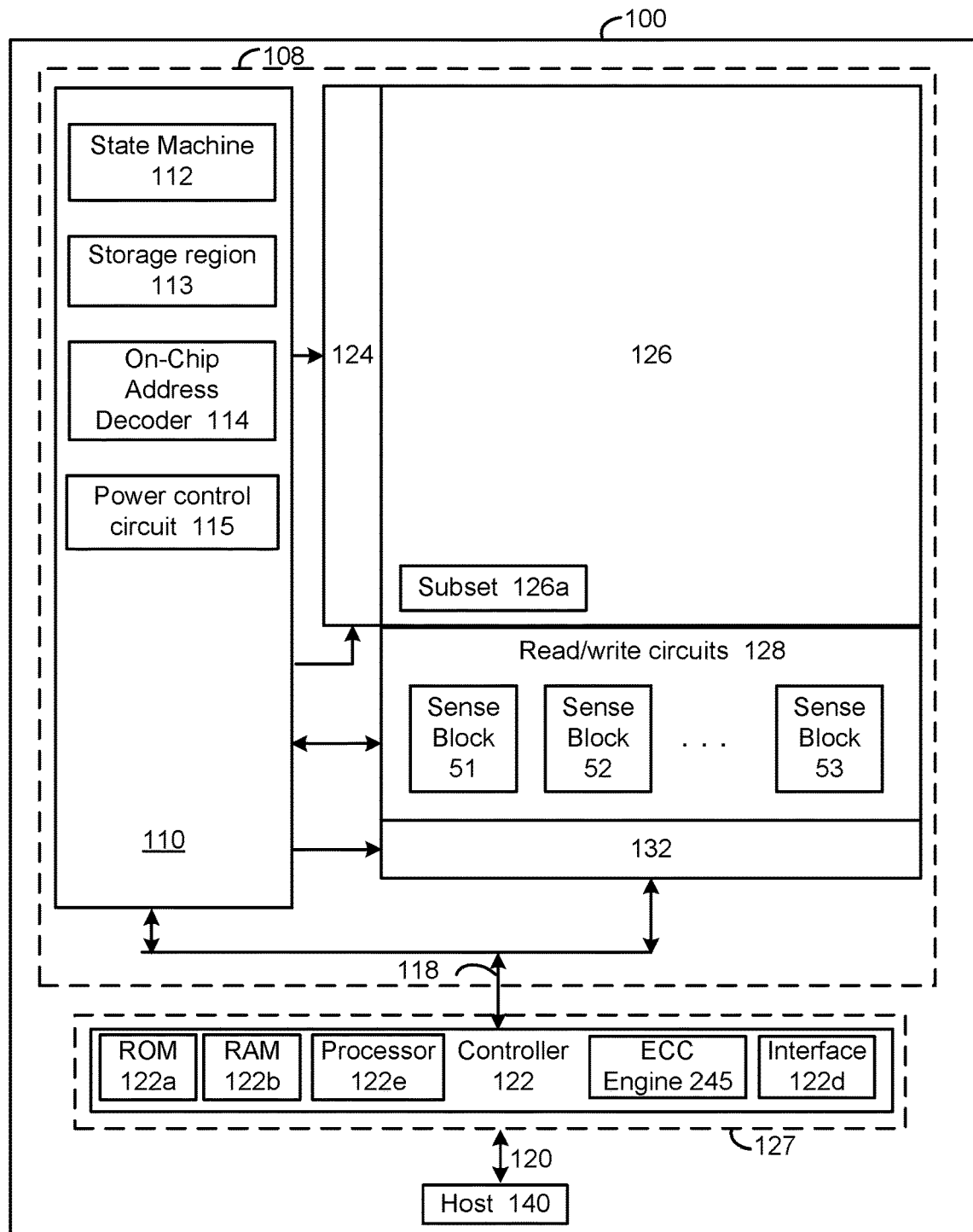
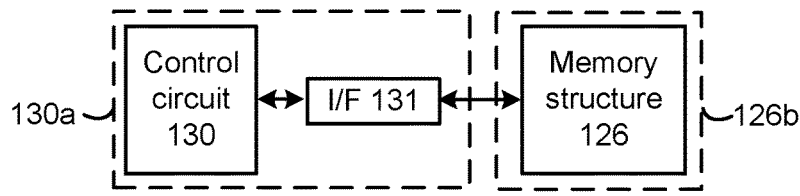
Fig. 1B

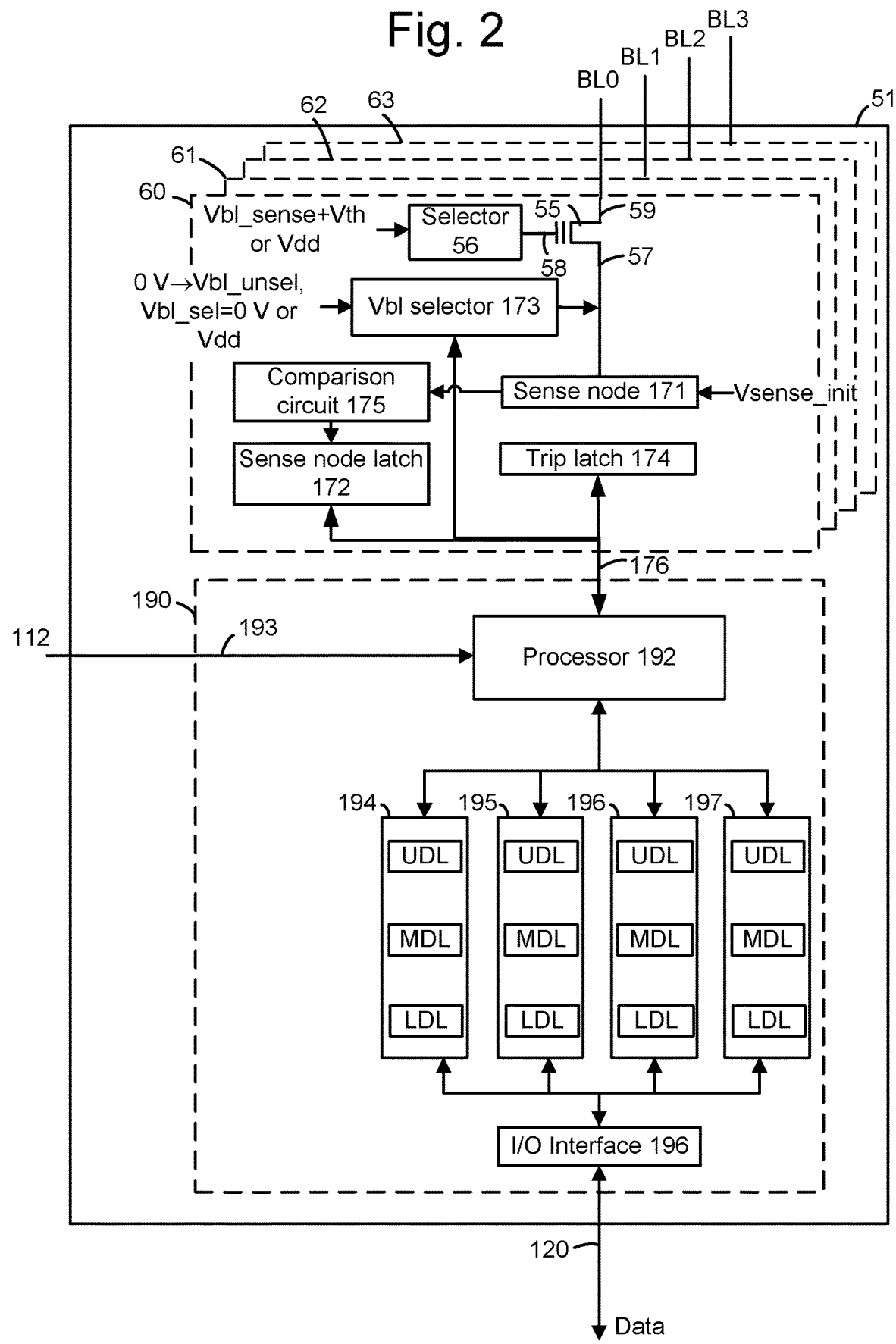

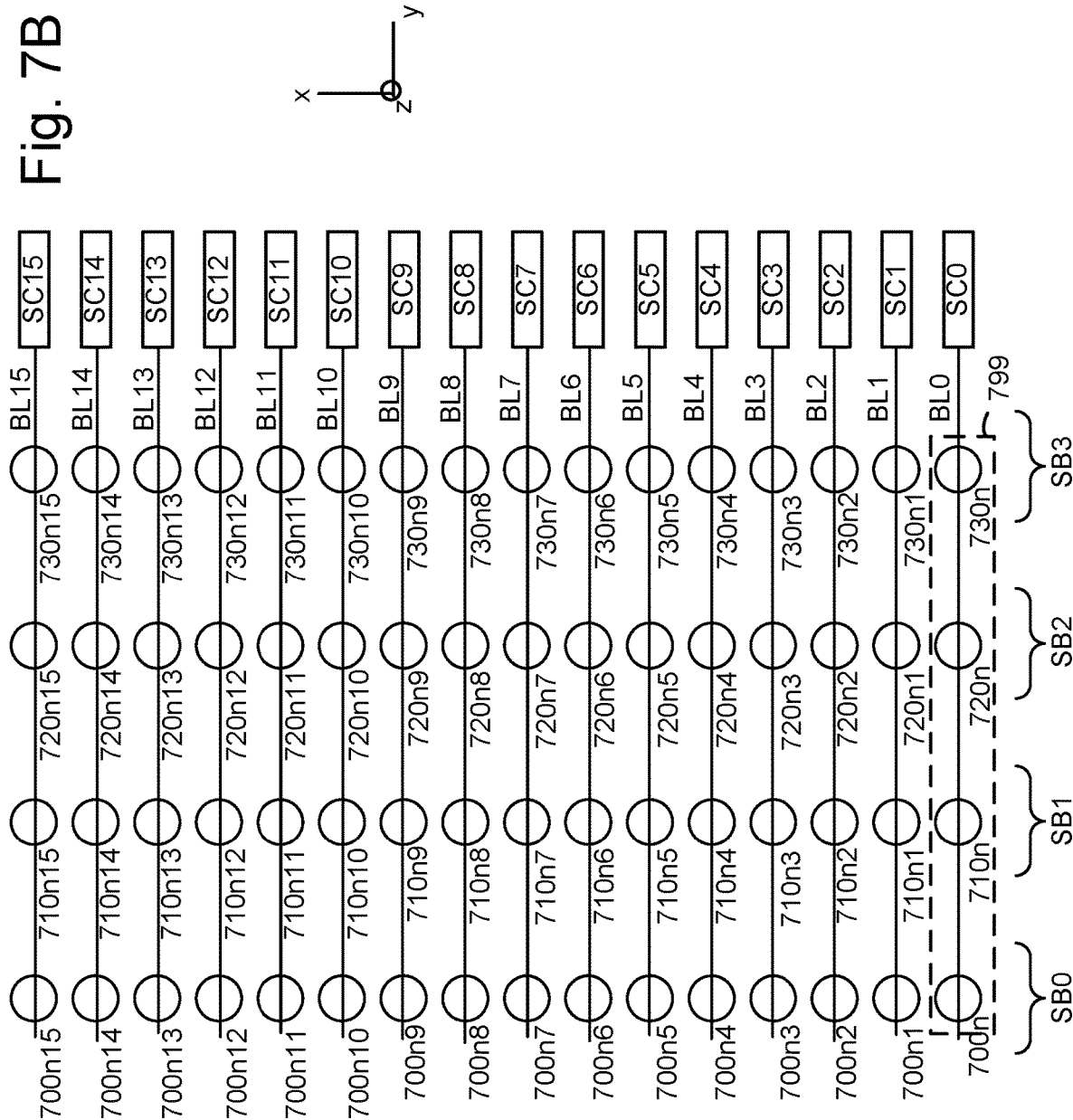

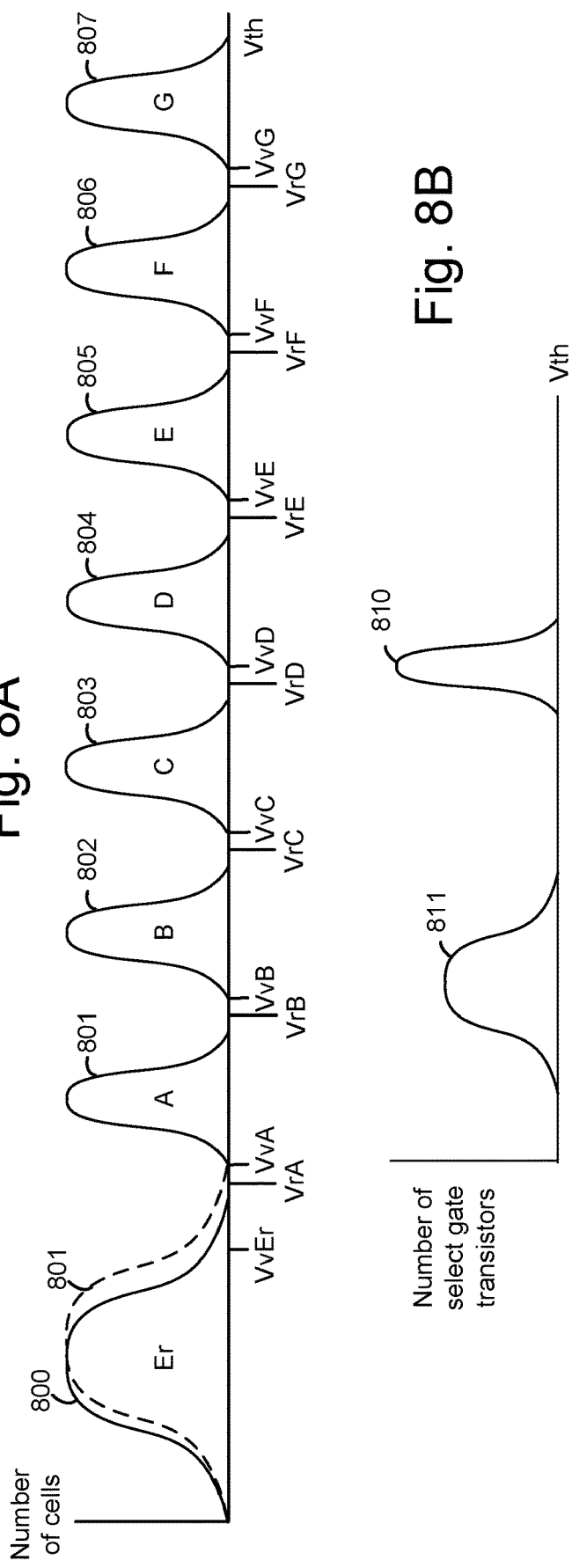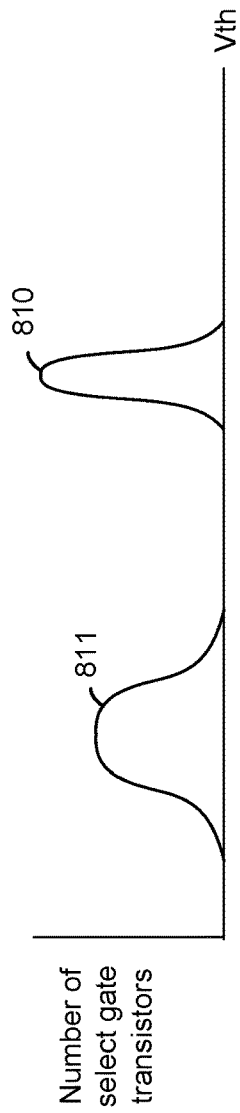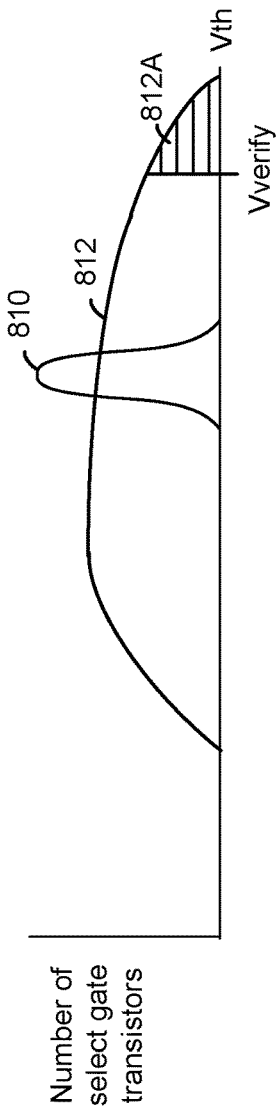

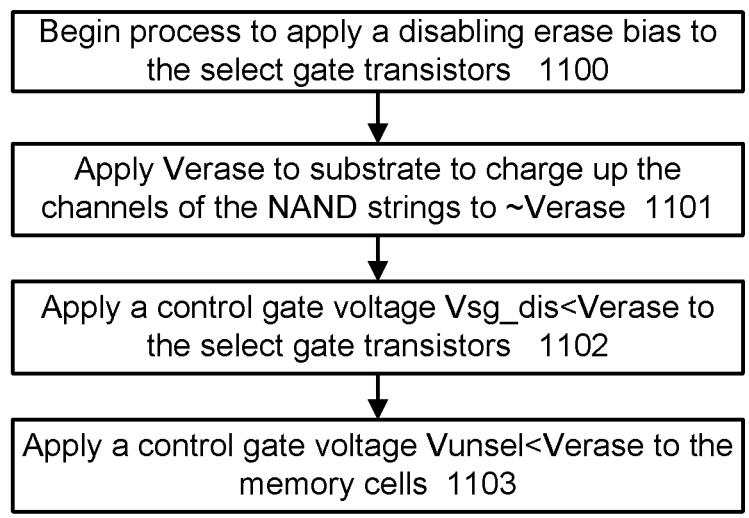
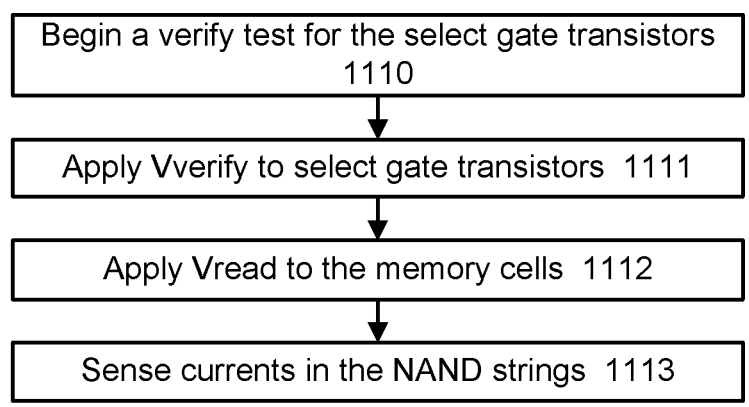

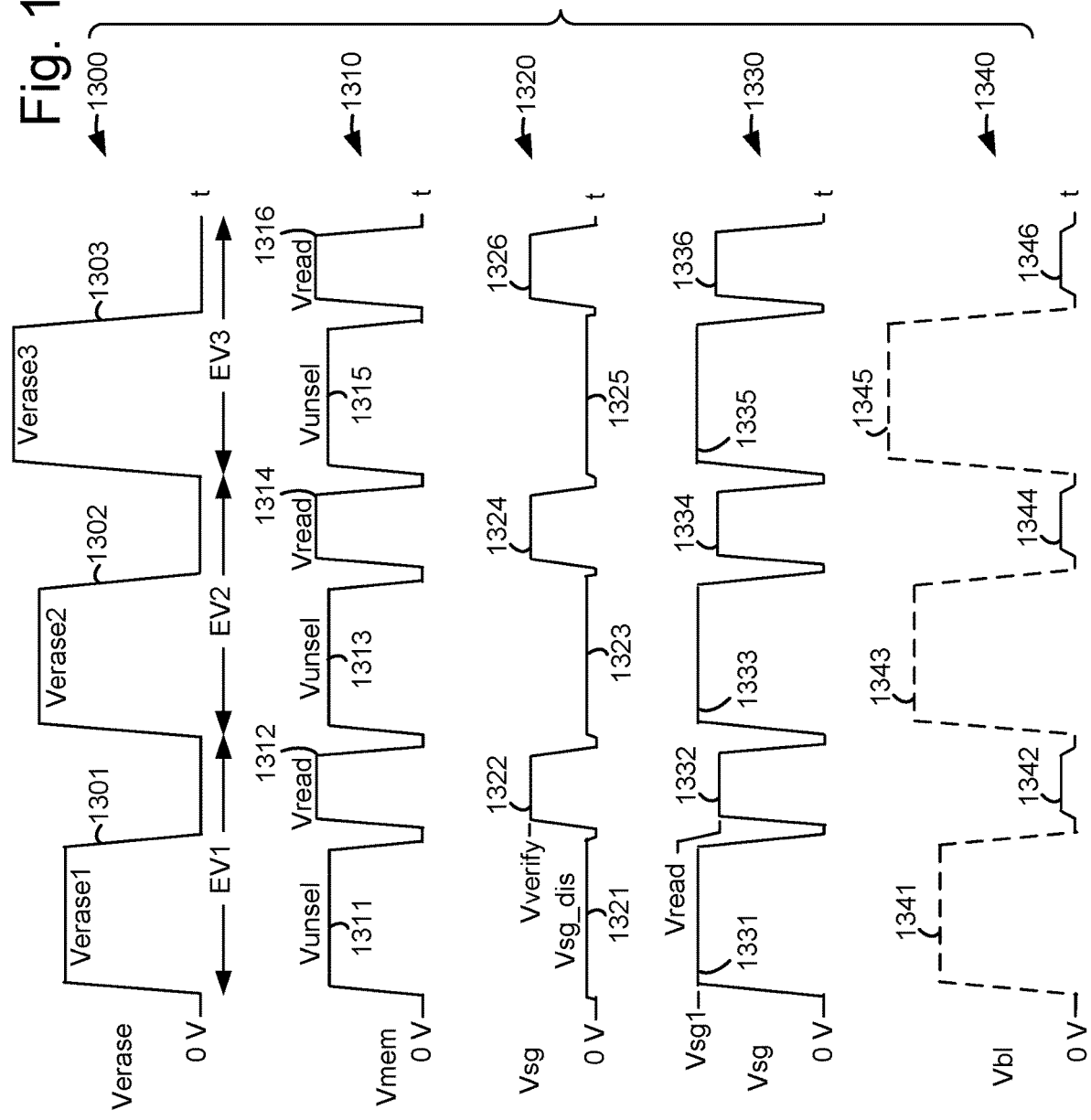

INSTANT AND PERMANENT SELF-DESTRUCTION METHOD IN 3D NAND FOR DATA SECURITY PURPOSE

CLAIM OF PRIORITY

This application claims priority to Chinese Patent Application No. 202010692333.0, entitled "AN INSTANT AND PERMANENT SELF-DESTRUCTION METHOD IN 3D NAND FOR DATA SECURITY PURPOSE," filed Jul. 17, 2020, incorporated by reference herein in its entirety.

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. For example, a charge-trapping material can be arranged vertically in a three-dimensional (3D) stacked memory structure. One example of a 3D memory structure is the Bit Cost Scalable (BiCS) architecture which comprises a stack of alternating conductive and dielectric layers.

A memory device includes memory cells which may be arranged in series, in NAND strings, for instance, where select gate transistors are provided at the ends of a NAND string to selectively connect a channel of the NAND string to a source line or bit line. However, various challenges are presented in operating such memory devices.

BRIEF DESCRIPTION OF THE DRAWINGS

FIG. 1A is a block diagram of an example memory device.

FIG. 1B is a block diagram of an arrangement of the memory device 100 of FIG. 1A in which a control circuit 130 on a first die 130*a* communicates with the memory structure 126 on a separate second die 126*b*.

FIG. 2 is a block diagram depicting one embodiment of the sense block 51 of FIG. 1A.

FIG. 7B depicts an example top view of the block B0-0 of FIG. 7A, with respective NAND strings, bit lines and sense circuits.

FIG. 8A depicts threshold voltage (Vth) distributions for an eight-state memory device.

FIG. 8B depicts example Vth distributions for select gate transistors when programmed (Vth distribution 810) and when erased in a normal erase operation (Vth distribution 811).

FIG. 8C depicts example Vth distributions for select gate transistors when programmed (Vth distribution 810) and when erased using a sufficiently strong erase bias which induces a phenomenon in which the threshold voltage of some of the select gate transistors increases (Vth distribution 812).

FIG. 11A depicts a process for applying an erase bias to select gate transistors, consistent with FIG. 10A, step 1003.

FIG. 11B depicts a process for performing a verify test for select gate transistors, consistent with FIG. 10A, step 1003 and FIG. 11A.

FIG. 13 depicts example waveforms in an operation consistent with the processes of FIGS. 11A and 11B.

DETAILED DESCRIPTION

Figure 3:
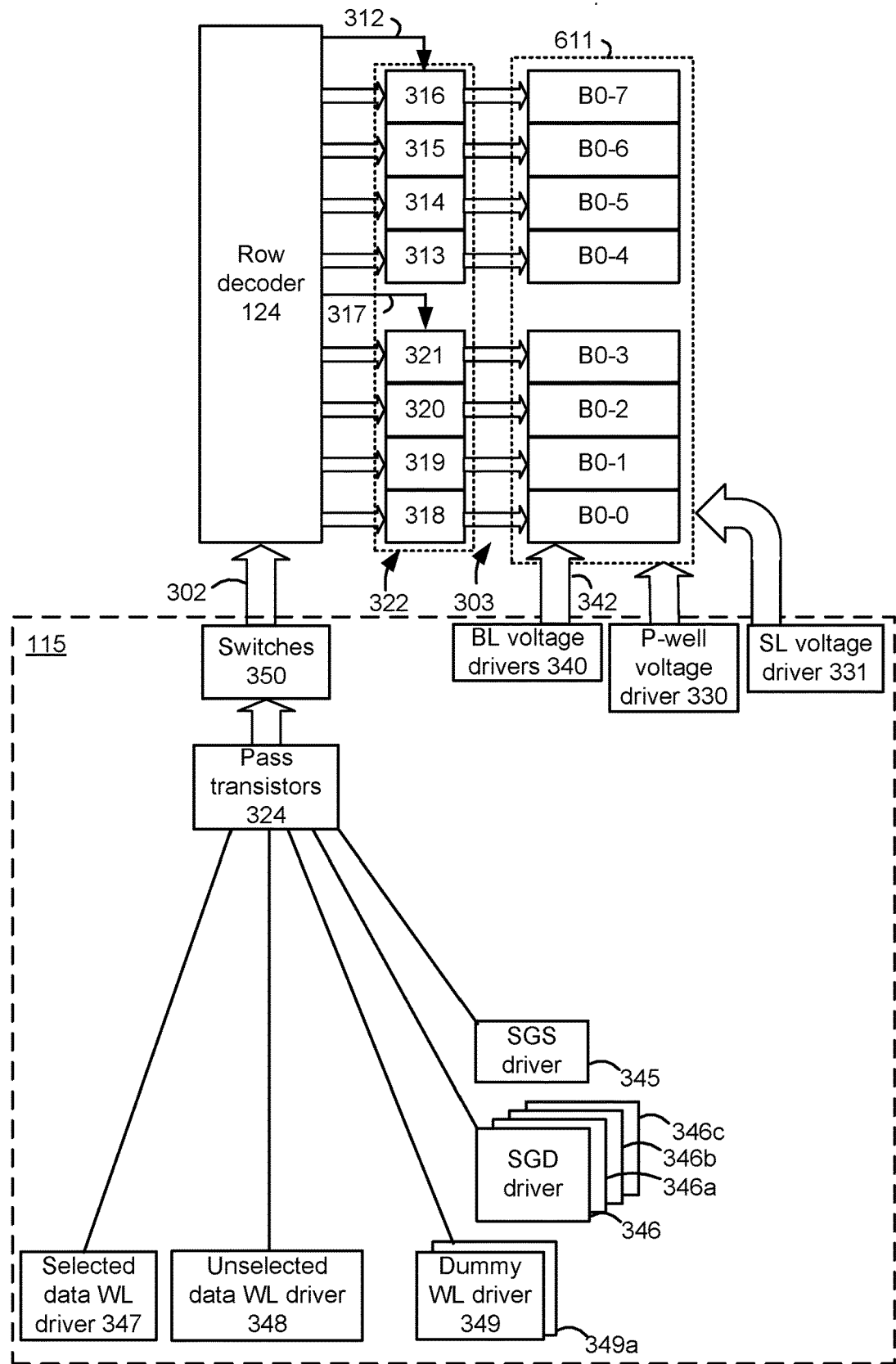
FIG. 3 depicts an example implementation of the power control circuit 115 of FIG. 1A for providing voltages to blocks of memory cells in a plane.

Apparatuses and techniques are described for performing an operation which irreversibly prevents access to a set of memory cells. The operation provides a strong erase bias for select gate transistors of NAND strings. The erase bias induces a phenomenon in the select gate transistors which permanently increases their threshold voltages. This prevents access to the memory cells such as for program or read operations.

In some memory devices, memory cells are joined to one another such as in NAND strings in a block or sub-block. Each NAND string comprises a number of memory cells connected in series between one or more drain end select gate transistors (referred to as SGD transistors), on a drain end of the NAND string which is connected to a bit line, and one or more source end select gate transistors (referred to as SGS transistors), on a source end of the NAND string or other memory string or set of connected memory cells, which is connected to a source line. The select gate transistors are also referred to as select gates. Further, the memory cells can be arranged with a common control gate line (e.g., word line) which acts a control gate. A set of word lines extends from the source-side of a block to the drain-side of a block. For example, see FIG. 7A. Memory cells can be connected in other types of strings and in other ways as well.

In a 3D memory structure, the memory cells may be arranged in vertical NAND strings in a stack in a substrate, where the stack comprises alternating conductive and dielectric layers. The conductive layers act as word lines which are connected to the memory cells. Each NAND string may have the shape of a pillar which intersects with the word lines to form the memory cells. Further, each NAND string includes various layers which extends vertically in the stack. For example, see the channel 660 and charge-trapping layer 664 in the NAND string 700n in FIG. 6. A source end 700s of the NAND string is connected to the substrate 611 and a drain end 700d of the NAND string is connected to a bit line, BL0. For example, see FIG. 6.

Memory structures, including those described above, are widely used for storage and data transfer in consumer devices, enterprise systems and industrial applications, for example, because of their nonvolatile capability, affordability, high storage density and access speed. Normally, customer requirements include high endurance and long data retention. However, in some scenarios, it is desirable to permanently prevent access to the memory structure, e.g., for a device which contains sensitive data and is at the end of its useful life or no longer in the possession of an authorized person. For example, consider a cell phone or laptop computer which is lost by its owner, who wishes to disable the device by a remote signal. Or, consider a satellite or unmanned aerial vehicle which cannot be retrieved. It may be desirable to both prevent access to the data as well as prevent any further use of the memory structure, such as storing new data or testing the memory structure to determine its characteristics. Permanent disabling of the memory structure and the die is desirable in these and other scenarios to secure the data.

One approach to preventing access to the data in a memory structure is to erase the data in an erase operation. However, a typical erase operation requires a relative long time to erase all of the blocks on a die, e.g., perhaps tens of seconds. Moreover, the erase operation does not prevent further use and testing of the memory structure. Another approach is to erase a block which has been reserved for storing parameters used when powering up the memory device. Such a block is referred to as a read-only memory (ROM) block, e.g., a User ROM block, since it is typically programmed only once, at the time of manufacture, and subsequently read over the lifetime of the memory device. However, the parameters can typically be recovered from a backup location. Other approaches rely on supplying a very high voltage such as 80 V to physically destroy the memory circuits by burning.

However, this approach requires additional components, in contrast to the goal of reducing size and weight.

Techniques provided herein address the above and other issues. In one aspect, an operation is performed which permanently increases the threshold voltages of select gate transistors in NAND strings. The operation involves providing a strong erase bias for the select gate transistors. The erase bias induces a phenomenon in the select gate transistors which permanently increases their threshold voltages to above a verify voltage which is greater than the threshold voltages of the memory cells. This prevents programming or reading of the memory cells. The select gate transistors can be at the drain-end and/or the source-end of the NAND strings.

The operation can involve one or more erase-verify iterations. In each erase-verify iteration, an erase bias is applied to the select gate transistors such as by charging up the channels of the NAND strings and holding a control gate voltage of the select gate transistors at a relatively low level, thereby causing a relatively high channel-to-control gate voltage. In one approach, an erase pulse with a magnitude of Verase is applied to the substrate on which a block of memory cells is formed to charge up the channels. If the erase bias is high enough, a phenomenon such as depicted in FIG. 8C can occur which increase the threshold voltage (Vth) of some of the select gate transistors. A verify test can be performed to determine if a minimum number of the select gate transistors have a Vth above a verify voltage, Vverify. If the verify test is passed, the operation is completed. If the verify test is not passed, another erase-verify iteration can be performed in which the magnitude and/or duration of Verase is increased. The erase bias can therefore be increased in each successive erase-verify iteration after an initial erase-verify iteration.

The operation can be performed on both the SGD and SGS transistors, in one approach. Or, the operation could be performed on the SGD transistors but not the SGS transistors, or on the SGS transistors but not the SGD transistors.

Figure 4:
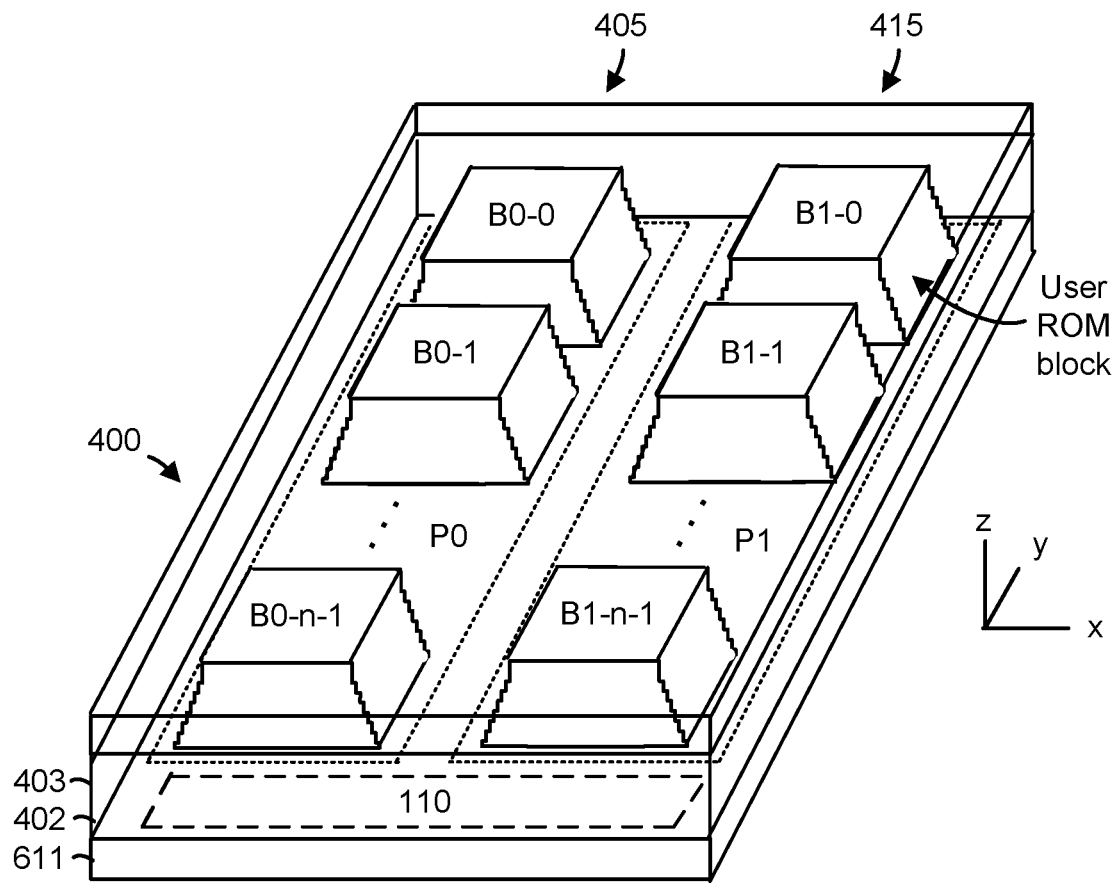
FIG. 4 is a perspective view of an example memory die 400 in which blocks of memory cells are provided in respective planes P0 and P1.

The operation can be performed on a set of blocks concurrently, a single block or a single sub-block of a block. When the operation is performed on a set of blocks, the verify test can be performed on a selected one of the blocks. This saves time compared to performing the verify test on each of the blocks. In one approach, the block selected for the verify test can be the User ROM block, while other blocks in the set are user data blocks. This approach is useful since the User ROM block is known to be a good, non-defective block. Block B1-0 in FIG. 4 is an example User ROM block.

The operation can be considered to be a permanent erase operation, disabling operation or self-destruct operation for the memory cells.

These and other features are discussed further below.

FIG. 1A is a block diagram of an example storage device. The memory device 100, such as a non-volatile storage system, may include one or more memory die 108. The memory die 108, or chip, includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . 53 (sensing circuitry) and allow a page of memory cells to be read or programmed in parallel. Typically a controller 122 is included in the same memory device 100 (e.g., a removable storage card) as the one or more memory die 108. The controller may be on a die 127 which is separate from the memory die 108. Commands and data are transferred between the host 140 and controller 122 via a data bus 120, and between the controller and the one or more memory die 108 via lines 118.

The memory structure can be 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control circuit 115. A storage region 113 may be provided, e.g., for operational parameters and software/code. In one embodiment, the state machine 112 is programmable by the software. In other embodiments, the state machine 112 does not use software and is completely implemented in hardware (e.g., electrical circuits).

The on-chip address decoder 114 provides an address interface between that used by the host or a memory controller to the hardware address used by the decoders 124 and 132. The power control circuit 115 controls the power and voltages supplied to the word lines, select gate lines, bit lines and source lines during memory operations. It can include drivers for word lines, SGS and SGD transistors and source lines. See also FIG. 3. The sense blocks can include bit line drivers, in one approach.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control circuit 115, sense blocks 51, 52, . . . , 53, read/write circuits 128, controller 122, and so forth. The state machine is an electrical circuit that can control operations of the control circuitry 110. In some embodiments, the state machine is implemented by or replaced by a microprocessor, microcontroller and/or RISC processor.

The off-chip controller 122 (which in one embodiment is an electrical circuit) may comprise a processor 122e, memory such as ROM 122a and RAM 122b and an error-correction code (ECC) engine 245. The ECC engine can correct a number of read errors. The RAM 122b can be a DRAM which stores non-committed data, for example. During programming, a copy of the data to be programmed is stored in the RAM 122b until the programming is successfully completed. In response to the successful completion, the data is erased from the RAM 122b and is committed or released to the block of memory cells. The RAM 122b may store one or more word lines of data.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The memory in the controller 122, such as such as ROM 122a and RAM 122b, comprises code such as a set of instructions, and the processor is operable to execute the set of instructions to provide the functionality described herein. Alternatively or additionally, the processor can access code from a subset 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122e fetches the boot code from the ROM 122a or the subset 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

The controller, e.g., RAM 122b and/or the control circuitry 110, can store parameters which indicate an expected number of fail bits in a block. These parameters can include, e.g., the number of bits per cell stored in the memory cells, a portion of the word lines which are programmed in a block or sub-block, a portion of the sub-blocks which are programmed in a block, a strength of an ECC process used to store and read data in the block, a duration of pre-read voltage pulse, if used, and a read accuracy, such as a bit line or word line voltage settling time and a number of sensing passes.

Generally, the control code can include instructions to perform the functions described herein including the steps of the flowcharts discussed further below, and provide the voltage waveforms including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable memory devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory (DRAM) or static random access memory (SRAM) devices, non-volatile memory devices, such as resistive random access memory (ReRAM), electrically erasable programmable read-only memory (EEPROM), flash memory (which can also be considered a subset of EEPROM), ferroelectric random access memory (FRAM), and magnetoresistive random access memory (MRAM), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in three dimensions.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory array may be arranged as multiple vertical columns (e.g., columns extending substantially perpendicular to the major surface of the substrate, i.e., in the y direction) with each column having multiple memory elements. Other configurations of memory elements in three dimensions can also constitute a 3D memory array.

In a 3D NAND memory array, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

FIG. 1B is a block diagram of an arrangement of the memory device 100 of FIG. 1A in which a control circuit 130 on a first die 130a communicates with the memory structure 126 on a separate second die 126b. The control circuit may communicate with the memory structure and the die 126b via a memory interface 131, for example, similar to the memory interface 122d. Examples of a memory interface (I/F) include the Common Flash Memory Interface of JEDEC. The techniques described herein can be implemented with a control die 130a bonded to one or more memory die 126b, where the memory die includes the memory structure 126 and the control die includes a control circuit 130 representing all, or subset, of the peripheral circuits of the memory structure. The control circuit can be on the same die as the plurality of memory cells, or on a different die than the plurality of memory cells.

For example, the memory structure may contain non-volatile memory cells. In some embodiments, the memory die and the control die are bonded together. The control circuit 130 can comprise a set of electrical circuits that perform memory operations (e.g., write, read, erase and others) on the memory structure. The control circuit can include the state machine 112, storage region 113, on-chip address decoder 114 and power control circuit 115. In another embodiment, one portion of the read/write circuits 128 are located on the control die 130a and another portion of the read/write circuits are located on memory die 126b. For example, the read/write circuits may contain sense amplifiers. The sense amplifiers can be located on the control die and/or the memory die.

The term "memory die" can refer to a semiconductor die that contains non-volatile memory cells for storage of data. The term, "control circuit die" can refer to a semiconductor die that contains control circuitry for performing memory operations on non-volatile memory cells on a memory die. Typically, numerous semiconductor die are formed from a single semiconductor wafer.

FIG. 2 is a block diagram depicting one embodiment of the sense block 51 of FIG. 1A. An individual sense block 51 is partitioned into one or more core portions, referred to as sense circuits 60-63 or sense amplifiers, and a common portion, referred to as a managing circuit 190. In one embodiment, each sense circuit is connected to a respective bit line and NAND string, and a common managing circuit 190 is connected to a set of multiple, e.g., four or eight, sense circuits. Each of the sense circuits in a group communicates with the associated managing circuit via data bus 176. Thus, there are one or more managing circuits which communicate with the sense circuits of a set of storage elements (memory cells).

The sense circuit 60, as an example, operates during a program loop to provide a pre-charge/program-inhibit voltage to an unselected bit line or a program-enable voltage to a selected bit line. An unselected bit line is connected to an unselected NAND string and to an unselected memory cell therein. An unselected memory cell can be a memory cell in an unselected NAND string, where the memory cell is connected to a selected or unselected word line. An unselected memory cell can also be a memory cell in a selected NAND string, where the memory cell is connected to an unselected word line. A selected bit line is connected to a selected NAND string and to a selected memory cell therein.

The sense circuit 60 also operates during a verify test in a program loop to sense a memory cell to determine whether it has completed programming by reaching an assigned data state, e.g., as indicated by its Vth exceeding the verify voltage of the assigned data state. The sense circuit 60 also operates during a read operation to determine the data state to which a memory cell has been programmed. The sense circuit 60 also operates in an erase operation during a verify test to determine whether a plurality of memory cells have a Vth below a verify voltage. The sense circuit performs sensing by determining whether a conduction current in a connected bit line is above or below a predetermined threshold level. This indicates whether the Vth of the memory cell is below or above, respectively, the word line voltage.

The sense circuit 60 also operates in a disable operation as described at the outset for permanently increasing the threshold voltage of select gate transistors to prevent access to memory cells. The sense circuit determines whether the Vth of the select gate transistors is above a verify voltage, Vverify, applied to the control gates of the select gate transistors.

The sense circuit may include a selector 56 or switch connected to a transistor 55 (e.g., an nMOS). Based on voltages at the control gate 58 and drain 57 of the transistor 55, the transistor can operate as a pass gate or as a bit line clamp. When the voltage at the control gate is sufficiently higher than the voltage on the drain, the transistor operates as a pass gate to pass the voltage at the drain to the bit line (BL) at the source 59 of the transistor. For example, a program-inhibit voltage such as 1-2 V may be passed when pre-charging and inhibiting an unselected NAND string. Or, a program-enable voltage such as 0 V may be passed to allow programming in a selected NAND string. The selector 56 may pass a power supply voltage Vdd, e.g., 3-4 V to the control gate of the transistor 55 to cause it to operate as a pass gate.

When the voltage at the control gate is lower than the voltage on the drain, the transistor 55 operates as a source-follower to set or clamp the bit line voltage at Vcg−Vth, where Vcg is the voltage on the control gate 58 and Vth, e.g., 1 V, is the threshold voltage of the transistor 55. This assumes the source line is at 0 V. This mode can be used during sensing operations such as read and verify operations. The bit line voltage is thus set by the transistor 55 based on the voltage output by the selector 56. For example, the selector 56 may pass Vbl_sense+Vth, e.g., 1.5 V, to the transistor 55 to provide Vbl_sense, e.g., 0.5 V, on the bit line. A Vbl selector 173 may pass a relatively high voltage such as Vdd to the drain 57, which is higher than the control gate voltage on the transistor 55, to provide the source-follower mode during sensing operations.

The Vbl selector 173 can pass one of a number of voltage signals. For example, the Vbl selector can pass a program-inhibit voltage signal which increases from an initial voltage, e.g., 0 V, to a program inhibit voltage, e.g., Vbl_inh for respective bit lines of unselected NAND string during a program loop. The Vbl selector 173 can pass a program-enable voltage signal such as 0 V for respective bit lines of selected NAND strings during a program loop. The Vbl selector may select a voltage signal from the BL voltage driver 340 in FIG. 3 based on commands from the processor 192, for example.

In one approach, the selector 56 of each sense circuit can be controlled separately from the selectors of other sense circuits. The Vbl selector 173 of each sense circuit can also be controlled separately from the Vbl selectors of other sense circuits During sensing, a sense node 171 is charged up to an initial voltage, Vsense_init, such as 3 V. The sense node is then passed to the bit line via the transistor 55, and an amount of decay of the sense node is used to determine whether a memory cell is in a conductive or non-conductive state. In particular, the comparison circuit 175 determines the amount of decay by comparing the sense node voltage to a trip voltage at a sense time. If the sense node voltage decays below the trip voltage, Vtrip, the memory cell is in a conductive state and its Vth is at or below the verify voltage. If the sense node voltage does not decay below Vtrip, the memory cell is in a non-conductive state and its Vth is above the verify voltage. A sense node latch 172 is set to 0 or 1, for example, by the comparison circuit 175 based on whether the memory cell is in a conductive or non-conductive state, respectively. The data in the sense node latch can be a bit which is read out by the processor 192 and used to update a trip latch 174. Subsequently, for a next program loop, a bit in the trip latch can be used by the processor, along with the assigned data state in the latches 194-197 to determine whether a memory cell and NAND string are selected or unselected for programming in the program loop, and to thereby pass the appropriate enable or inhibit bit line voltage, respectively, to the bit line. The latches 194-197 may be considered to be data latches or user data latches because they store the data to be programmed into the memory cells.

The managing circuit 190 comprises a processor 192, four example sets of data latches 194-197 for the sense circuits 60-63, respectively, and an I/O interface 196 coupled between the sets of data latches and the data bus 120. One set of three data latches, e.g., comprising individual latches LDL, MDL and UDL, can be provided for each sense circuit. In some cases, a different number of data latches may be used. In a three bit per cell embodiment, LDL stores a bit for a lower page of data, MDL stores a bit for a middle page of data and UDL stores a bit for an upper page of data.

The processor 192 performs computations, such as to determine the data stored in the sensed memory cell and store the determined data in the set of data latches. Each set of data latches 194-197 is used to store data bits determined by processor 192 during a read operation, and to store data bits imported from the data bus 120 during a program operation which represent write data meant to be programmed into the memory. I/O interface 196 provides an interface between data latches 194-197 and the data bus 120.

During reading, the operation of the system is under the control of state machine 112 that controls the supply of different control gate voltages to the addressed memory cell. As it steps through the various predefined control gate voltages corresponding to the various memory states supported by the memory, the sense circuit may trip at one of these voltages and a corresponding output will be provided from sense circuit to processor 192 via the data bus 176. At that point, processor 192 determines the resultant memory state by consideration of the tripping event(s) of the sense circuit and the information about the applied control gate voltage from the state machine via input lines 193. It then computes a binary encoding for the memory state and stores the resultant data bits into data latches 194-197.

Some implementations can include multiple processors 192. In one embodiment, each processor 192 will include an output line (not depicted) such that each of the output lines is wired-OR'd together. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 194-197 from the data bus 120. During reprogramming, a respective set of data latches of a memory cell can store data indicating when to enable the memory cell for reprogramming based on the program pulse magnitude.

The program operation, under the control of the state machine, applies a series of programming voltage pulses to the control gates of the addressed memory cells. Each voltage pulse may be stepped up in magnitude from a previous program pulse by a step size in a processed referred to as incremental step pulse programming. Each program voltage is followed by a verify operation to determine if the memory cells has been programmed to the desired memory state. In some cases, processor 192 monitors the read back memory state relative to the desired memory state. When the two are in agreement, the processor 192 sets the bit line in a program inhibit mode such as by updating its latches. This inhibits the memory cell coupled to the bit line from further programming even if additional program pulses are applied to its control gate.

Each set of data latches 194-197 may be implemented as a stack of data latches for each sense circuit. In one embodiment, there are three data latches per sense circuit 60. In some implementations, the data latches are implemented as a shift register so that the parallel data stored therein is converted to serial data for data bus 120, and vice versa. All the data latches corresponding to the read/write block of memory cells can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated memory cell has reached certain mileposts in a program operations. For example, latches may identify that a memory cell's Vth is below a particular verify voltage. The data latches indicate whether a memory cell currently stores one or more bits from a page of data. For example, the LDL latches can be used to store a lower page of data. An LDL latch is flipped (e.g., from 0 to 1) when a lower page bit is stored in an associated memory cell. For three bits per cell, an MDL or UDL latch is flipped when a middle or upper page bit, respectively, is stored in an associated memory cell. This occurs when an associated memory cell completes programming.

FIG. 3 depicts an example implementation of the power control circuit 115 of FIG. 1A for providing voltages to blocks of memory cells in a plane. The circuitry shown can be repeated for each plane of a die, in one approach. In this example, the memory structure 126 includes a set of four related blocks, B0-0 to B0-3, and another set of four related blocks, B0-4 to B0-7. See also FIG. 4. The blocks can be in one or more planes. The row decoder 124 of FIG. 1A provides voltages to word lines and select gate control lines of each block via pass transistors 322. In one approach, a separate row decoder is provided for each block. The row decoder provides a control signal to pass transistors which connect the blocks to the row decoder. In one approach, the pass transistors of each set of blocks are controlled by a common control gate voltage. Thus, the pass transistors for a set of block are either all on or off at a given time. If the pass transistors are on, a voltage from the row decoder is provided to the respective control gate lines or word lines. If the pass transistors are off, the row decoder is disconnected from the respective control gate lines or word lines so that the voltage floats on the respective control gate lines or word lines.

For instance, a control gate line 312 is connected to sets of pass transistors 313-316, which in turn are connected to control gate lines of B0-4 to B0-7, respectively. A control gate line 317 is connected to sets of pass transistors 318-321, which in turn are connected to control gate lines of B0-0 to B0-3, respectively.

Typically, program or read operations are performed on one selected sub-block at a time in a block. An erase operation may be performed on a selected block or sub-block. The row decoder can connect global control lines 302 to local control lines 303. The control lines represent conductive paths. Voltages are provided on the global control lines from a number of voltage drivers. Some of the voltage drivers may provide voltages to switches 350 which connect to the global control lines. Pass transistors 324 are controlled to pass voltages from the voltage drivers to the switches 350.

The voltage drivers can include a selected data word line (WL) driver 347, which provides a voltage on a data word line selected during a program or read operation. The driver 347 can provide a pre-charge voltage and a program voltage on WLn during a program loop of a program operation. A driver 348 can be used for unselected data word lines, and dummy word line drivers 349 and 349*a* can be used to provide voltages on dummy word lines WLDD and WLDS, respectively, in FIG. 6.

The voltage drivers can also include separate SGD drivers for each sub-block. For example, SGD drivers 346, 346*a*, 346*b* and 346*c* can be provided for SB0, SB1, SB2 and SB3, respectively, such as in FIG. 7A. The SGD drivers provide a voltage to a control line connected to the control gates of an SGD transistor (drain-side select gate transistor). In one option, an SGS driver 345 is common to the different sub-blocks in a block, and provides a voltage to a control line connected to the control gates of the SGS transistors (source-side select gate transistors).

The various components, including the row decoder, may receive commands from a controller such as the state machine 112 or the controller 122 to perform the functions described herein.

The p-well voltage driver 330 provides a voltage Vp-well to the p+ contact 612*b* in the p-well region 611*b*, e.g., via the conductive path 682. See FIG. 6. In one approach, the p-well region 611*b* is common to the blocks. Vp-well can be the same as Verase in FIGS. 12 and 13. A set of bit lines 342 is also shared by the blocks. The source line (SL) voltage driver 331 provides a voltage Vsl to the n+ contact 612*c* in the p-well region 611*b*, e.g., via the local interconnect 651.

Bit line voltage drivers 340 include voltage sources which provide voltages to the bit lines 342. The bit line voltage for sensing in an erase verify test can be 0.5 V, for example.

In a stacked memory device such as depicted in FIGS. 4 to 7B, sets of connected memory cells may be arranged in NAND strings which extend vertically upward from the substrate. The bottom (or source end) of each NAND string is in contact with the substrate, e.g., the well region, and the top end (or drain end) of each NAND string is connected to a respective bit line, in one approach.

FIG. 4 is a perspective view of an example memory die 400 in which a plurality of blocks of memory cells are provided in respective planes P0 and P1, consistent with FIG. 1A. The memory die includes a substrate 611, an intermediate region 402 in which blocks of memory cells are formed, and an upper region 403 in which one or more upper metal layers are patterned such as to form bit lines. Planes P0 and P1 represent respective isolation regions which are formed in the substrate 611. Further, a first block sequence 405 of a number n blocks, labelled B0-0 to B0-$n$-1, are formed in P0, and a second block sequence 415 of a number n blocks, labelled B1-0 to B1-$n$-1, are formed in P1. Each plane may have associated row and column control circuitry, such as the row decoder 124, read/write circuits 128 and column decoder 132 of FIG. 1A.

The control circuitry 110, which may be located in a peripheral area of the die, may be shared among the planes, in one approach. Each plane may have a separate set of bit lines.

By providing blocks of memory cells in multiple planes, parallel operations can be performed in the planes. For example, blocks in a different planes can be erase concurrently.

The substrate 611 can also carry circuitry under the blocks, and one or more lower metal layers which are patterned in conductive paths to carry signals of the circuitry.

In this example, the memory cells are formed in vertical NAND strings in the blocks. Each block comprises a stacked area of memory cells, where alternating levels of the stack represent word lines. In one possible approach, each block has opposing tiered sides from which vertical contacts extend upward to an upper metal layer to form connections to conductive paths. While two planes are depicted as an example, other examples can use four or more planes. One plane per die is also possible.

The plurality of blocks typically include user data blocks and one or more read-only memory (ROM) blocks, e.g., User ROM blocks. The user data blocks are available for repeated program, read and erase operations during the lifetime of the memory device. These blocks typically store user data which is provided by the host. A ROM block, also referred to as a user ROM block, typically maintains the same data over the lifetime of the memory device and is not altered, as mentioned at the outset. The data in the User ROM block can include data identifying bad (defective) columns or bad blocks among the user data blocks, for instance. The data in the User ROM block can include parameters for configuring the memory device after a power up. The one or more User ROM blocks are tested at the time of manufacture to ensure they are not defective.

When the memory device is powered on, the bad column data is read in by a controller and used to provide a column replacement table for use during read and write operations. In some cases, to increase reliability, the ROM block stores data using one bit per cell. The user data blocks can store data with a higher density using two or more bits per cell.

For example, B1-0 may be a User ROM block while the remaining blocks B0-0 to B0-$n$-1 and B1-1 to B1-$n$-1 are user data blocks.

Figure 5:
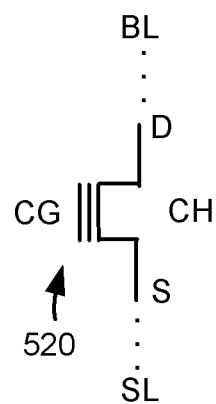
FIG. 5 depicts an example transistor 520 in the memory structure 126 of FIG. 1A.

FIG. 5 depicts an example transistor 520 in the memory structure 126 of FIG. 1A. The transistor comprises a control gate CG, a drain D, a source S and a channel CH and may represent a memory cell or a select gate transistor, for example. The drain end of the transistor is connected to a bit line BL optionally via one or more other transistors in a NAND string, and the source end of the transistor is connected to a source line SL optionally via one or more other transistors in a NAND string. The transistor can represent a memory cell or a select gate transistor, for example.

Figure 6:
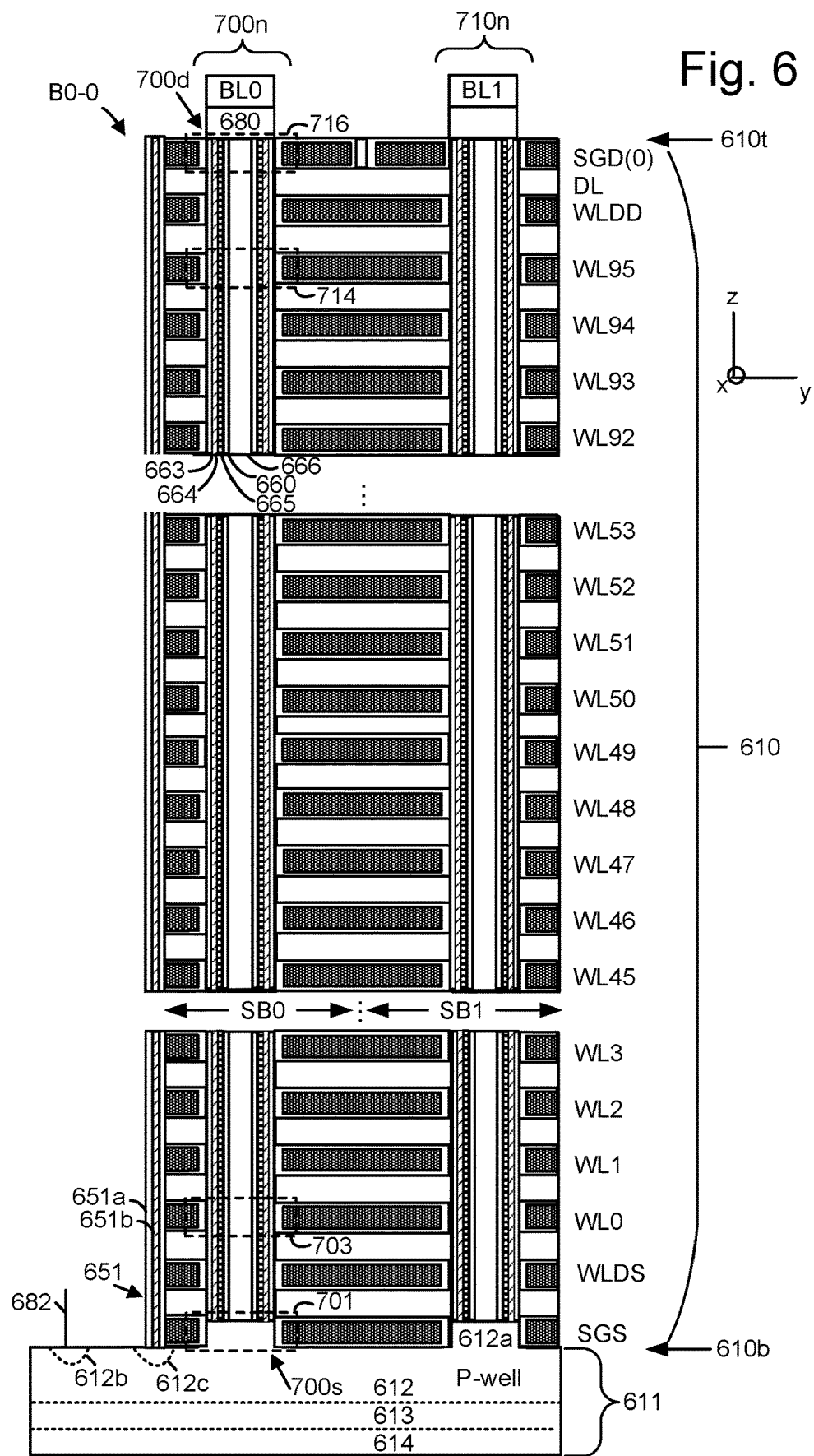
FIG. 6 depicts an example cross-sectional view of a portion of the block B0-0 of FIG. 4, including NAND strings 700*n* and 710*n*.

FIG. 6 depicts an example cross-sectional view of a portion of the block B0-0 of FIG. 4, including NAND strings 700$n$ and 710$n$. In this example, the NAND strings 700$n$ and 710$n$ are in different sub-blocks SB0 and SB1, respectively. The block comprises a stack 610 of alternating conductive layers (word line layers) and dielectric layers. The layers may be rectangular plates having a height in the z direction, a width in the y direction, and a length in the x direction.

The stack is depicted as comprising one tier but can optionally include one or more tiers of alternating conductive and dielectric layers. A stack comprises a set of alternating conductive and dielectric layers in which a memory hole is formed in a fabrication process.

The conductive layers comprise SGS, WLDS, WL0-WL95, WLDD and SGD(0). The conductive layers connected to control gates of memory cells are referred to as word lines, and the conductive layers connected to control gates of source-side select gate transistors and drain-side select gate transistors are referred to as source-side and drain-side control lines, respectively. WLDS and WLDD are dummy word lines or conductive layers connected to dummy memory cells, which are ineligible to store user data. A dummy memory cell may have the same construction as a data memory cell but is considered by the controller to be ineligible to store any type of data including user data. One or more dummy memory cells may be provided at the drain and/or source ends of a NAND string of memory cells to provide a gradual transition in the channel voltage gradient. The use of dummy memory cells is optional. WL0-WL95 are data word lines connected to data memory cells, which are eligible to store user data. As an example only, the stack includes ninety-six data word lines. DL is an example dielectric layer.

A top 610$t$ and bottom 610$b$ of the stack are depicted. WL95 is the topmost data word line or conductive layer and WL0 is the bottommost data word line or conductive layer.

The NAND strings are formed by etching memory holes in the stack, then depositing multiple thin layers of materials along the sidewalls of the memory holes. Memory cells are formed in a region in which the word lines intersect with the multiple thin layers, and select gate transistors are formed in regions in which the SGS and SGD control lines intersect with the multiple thin layers. For example, a drain-side select gate transistor 716 is formed where the SGD control line intersects with the multiple thin layers, a source-side select gate transistor 701 is formed where the SGS control line intersects with the multiple thin layers, a topmost data memory cell 714 is formed where the WL95 word line intersects with the multiple thin layers, and a bottommost data memory cell 703 is formed where the WL0 word line intersects with the multiple thin layers.

The multiple thin layers can form annular layers and can be deposited, e.g., using atomic layer deposition. For example, the layers can include a blocking oxide layer 663, a charge-trapping layer 664 or film such as silicon nitride (Si3N4) or other nitride, a tunneling layer 665 (e.g., a gate oxide) and a channel 660 (e.g., comprising polysilicon). A dielectric core 666 (e.g., comprising silicon dioxide) can also be provided. A word line or control line can comprise a metal such as Tungsten. In this example, all of the layers are provided in the memory hole. In other approaches, some of the layers can be provided in the word line or control line layer. The multiple thin layers form a columnar active area (AA) of a NAND string.

The stack is formed on a substrate 611. In one approach, the substrate includes a p-well region 612 connected to the source ends of the NAND strings. The p-well region may comprise epitaxial regions 612a which extend upward adjacent to the source-side select gate transistors. The p-well region can include an n+ contact 612c connected to a local interconnect 651 for receiving a source line voltage, and a p+ contact 612b connected to a conductive path 682 for receiving a p-well voltage. The local interconnect 651 can comprise a conductive material 651b such as metal surrounded by insulating material 651a to prevent conduction with the metal of the adjacent word lines. The p-well region is formed in an n-well 613, which in turn is formed in a p-type semiconductor region 614 of the substrate, in one possible implementation.

The NAND string 700n has a source end 700s at a bottom 610b of the stack 610, connected to the p-well. The NAND string 700n also has a drain end 700d at a top 610t of the stack, connected to a bit line BL0 via a bit line contact 680 comprising an n-type material.

The NAND strings can be considered to have a floating body channel because the length of the channel is not formed on a substrate.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the channels of the NAND string are charged up, such as by applying a positive erase pulse to the substrate via the local interconnect 651, causing the injection of holes into the charge trapping layer.

Figure 7A:
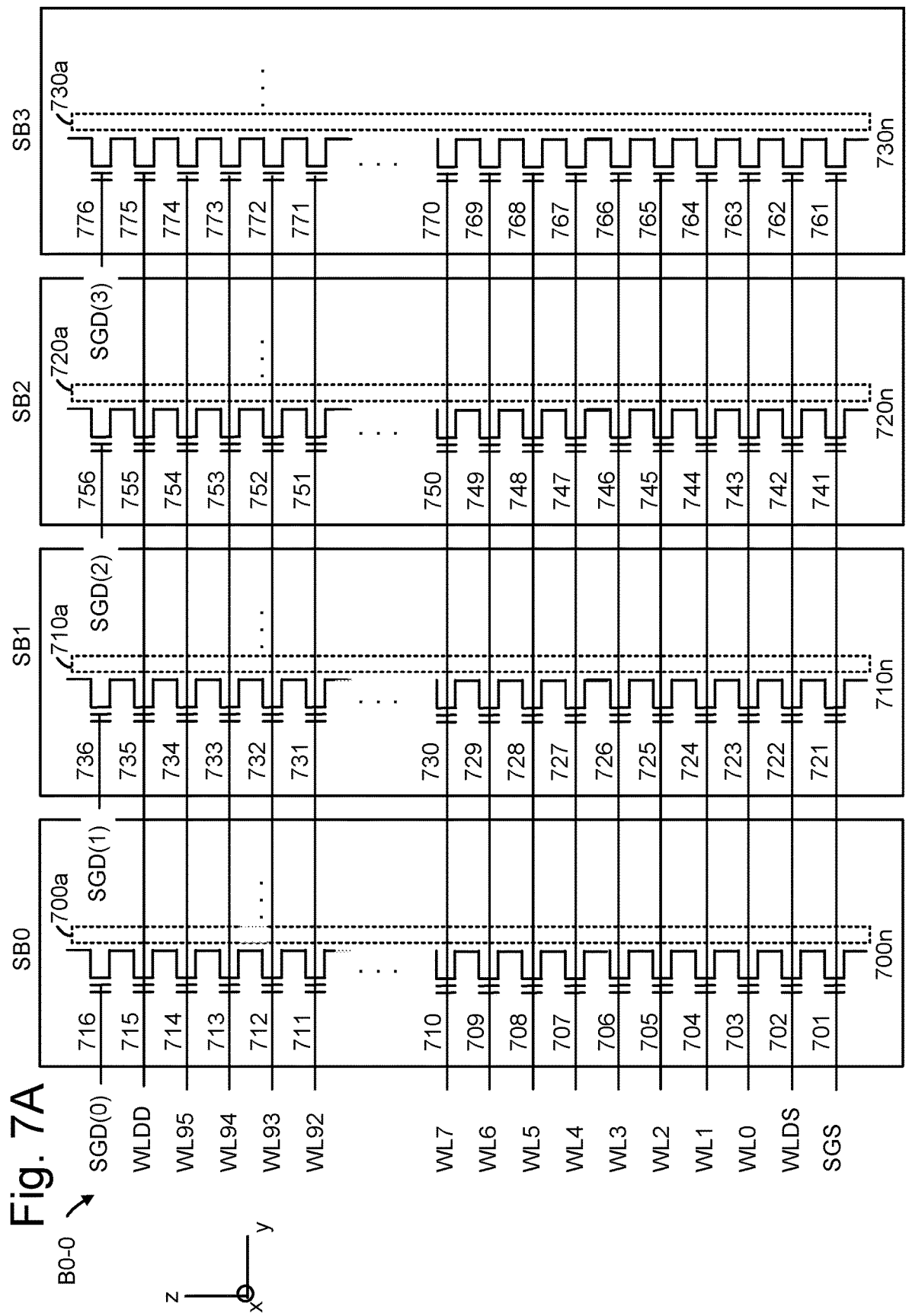
FIG. 7A depicts an example view of NAND strings in the block B0-0 which is consistent with FIGS. 4 and 6.

FIG. 7A depicts an example view of NAND strings in the block B0-0 which is consistent with FIGS. 4 and 6. The NAND strings are arranged in sub-blocks of the block in a 3D configuration. Each sub-block includes multiple NAND strings, where one example NAND string is depicted. For example, SB0, SB1, SB2 and SB3 comprise example NAND strings 700n, 710n, 720n and 730n, respectively. The NAND strings have data word lines, dummy word lines and select gate lines consistent with FIG. 6. Each sub-block comprises a set of NAND strings which extend in the x direction and which have a common SGD line or control gate layer. The NAND strings 700n, 710n, 720n and 730n are in sub-blocks SB0, SB1, SB2 and SB3, respectively. Programming of the block may occur based on a word line programming order. One option is to program the memory cells in different portions of a word line which are in the different sub-blocks, one sub-block at a time, before programming the memory cells of the next word line. For example, this can involve programming WL0 in SB0, SB1, SB2 and then SB3, then programming WL1 in SB0, SB1, SB2 and then SB3, and so forth. The word line programming order may start at WL0, the source end word line and end at WL95, the drain end word line, for example.

In an erase operation, typically the entire block is erased, although a partial block erase is also possible such as by erasing a selected sub-block of the block and/or by erasing memory cells connected to a subset of the word lines which is fewer than all of the word lines.

The plurality of memory cells of B0-0 are arranged in NAND strings, where each NAND string comprising a continuous charge trapping layer along a length of the NAND string. The NAND strings 700n, 710n, 720n and 730n have channels 700a, 710a, 720a and 730a, respectively. Additionally, NAND string 700n includes SGS transistor 701, dummy memory cell 702, data memory cells 703-714, dummy memory cell 715 and SGD transistor 716. NAND string 710n includes SGS transistor 721, dummy memory cell 722, data memory cells 723-734, dummy memory cell 735 and SGD transistor 736. NAND string 720n includes SGS transistor 741, dummy memory cell 742, data memory cells 743-754, dummy memory cell 755 and SGD transistor 756. NAND string 730n includes SGS transistor 761, dummy memory cell 762, data memory cells 763-774, dummy memory cell 775 and SGD transistor 776.

This example depicts one SGD transistor at the drain end of each NAND string, and one SGS transistor at the source end of each NAND string. The SGD transistors in SB0, SB1, SB2 and SB3 may be driven by separate control lines SGD(0), SGD(1), SGD(2) and SGD(3), respectively, in one approach. In another approach, multiple SGD and/or SGS transistors can be provided in a NAND string.

FIG. 7B depicts an example top view of the block B0-0 of FIG. 7A, with respective NAND strings, bit lines and sense circuits. The view is in the x-y plane. Each circle represents a NAND string. In this example, sixteen NAND strings per sub-block are depicted. SB0 includes the NAND string 700n of FIG. 7A and additional NAND strings 700n1-700n15. SB1 includes the NAND string 710n of FIG. 7A and additional NAND strings 710n1-710n15. SB2 includes the NAND string 720n of FIG. 7A and additional NAND strings 720n1-720n15. SB3 includes the NAND string 730n of FIG. 7A and additional NAND strings 730n1-730n15.

A set of bit lines BL0-BL15 are connected to the NAND strings. Each bit line is connected to a respective set of NAND strings, including one NAND string in each sub-block. For example, BL0 is connected to NAND strings 700n, 710n, 720n and 730n in a set of NAND strings 799, BL1 is connected to NAND strings 700n1, 710n1, 720n1 and 730n1, and so forth. Each bit line is also connected to a respective sense circuit, consistent with the sense circuits 60-63 of FIG. 2. For example, BL0-BL15 are connected to sense circuits SC0-SC15, respectively.

In a verify test in a disabling erase operation as described herein, a verify voltage Vverify is applied to the select gate transistors. See FIG. 13. At the same time, each sense circuit senses a current on a respective bit line based on a sum of the currents in the respective NAND strings connected to the bit line. For example, SC0 can sense a current on BL0 based on currents in the NAND strings 700n, 710n, 720n and 730n. Thus, a verify test can involve sensing a current in a set of NAND strings connected to each bit line. A set of NAND strings passes the verify test if the current is below a specified level, e.g., the threshold voltages of the select gate transistors in the set of NAND strings are above Vverify. A block passes the verify test if at least a minimum number of the select gate transistors pass the verify test. In another possible approach, the sensing occurs one sub-block at a time for each bit line.

A set of NAND strings, which may comprise all NAND strings in a block or sub-block, for example, can be considered to pass a verify test when all or nearly all of the select gate transistors pass the verify test. For example, a pass may occur when at least 1-5% of the NAND strings pass the verify test.

FIG. 8A depicts threshold voltage (Vth) distributions for an eight-state memory device. Eight data states, or three bits per cell, are depicted as an example. In another example, two data states (one bit per cell), four data states (two bits per cell) or sixteen data states (four bits per cell) per memory cell are used. The vertical axis depicts a number of memory cells on a logarithmic scale and the horizontal axis depicts a threshold voltage on a linear scale. The Vth distributions can represent memory cells connected to a word line or all memory cells in a block. After erasing the block, the Vth distribution 800 is obtained, representing the erased state. The erase operation is completed when the Vth of all, or nearly all, of the memory cells is below a verify voltage of VvEr.

The memory cells are then subject to a programming operation. Each of the memory cells will have an assigned data state. Some of the memory cells are assigned to the erased state and are not programmed. Most of the memory cells are programmed to higher states, such as A-F, in this example, as represented by Vth distributions 801-807, respectively. These memory cells are subject to verify tests using verify voltages of VvA-VvG. The programming of the higher state memory cells can disturb the erased state memory cells, resulting in the widened and upshifted Vth distribution 801. The memory cells can be read using read voltages VrA-VrG.

FIG. 8B depicts example Vth distributions for select gate transistors when programmed (Vth distribution 810) and when erased in a normal erase operation (Vth distribution 811). The Vth of the select gate transistors can be set at the time of manufacture, for example, by programming the select gate transistors. In FIGS. 8B and 8C, the vertical axis depicts a number of select gate transistors on a logarithmic scale and the horizontal axis depicts a threshold voltage on a linear scale. For example, a select gate transistor could be programmed in a similar way as a memory cell by injecting charges into a charge trapping layer. The programmed Vth is typically maintained over the lifetime of the select gate transistors, although the Vth could be periodically measured and adjusted. An example Vth of a programmed select gate transistor is 2-4 V.

FIG. 8C depicts example Vth distributions for select gate transistors when programmed (Vth distribution 810) and when erased using a sufficiently strong erase bias which induces a phenomenon in which the threshold voltage of some of the select gate transistors increases (Vth distribution 812). As mentioned, a phenomenon can occur in a select gate transistor in which the threshold voltage is permanently and irreversibly increased when a strong erase bias is applied. The erase bias refers to a channel-to-control gate voltage. The phenomenon has been observed in tests, and is believed to involve back tunneling of electrons from the select gate line to the blocking oxide layer. The electrons are trapped in defects or trap states in the blocking oxide layer, which may comprise Al2O3, for example. Such defects are believed to be caused during the fabrication process and located mainly at the top and bottom of a block, at the drain-end and source-end, respectively, of the NAND strings. As a result, the phenomenon is more likely to occur for the SGD and SGS transistors compared to the memory cells since the SGD and SGS transistors are at the top and bottom, respectively, of the stack.

The phenomenon, but much weaker, could also occur for dummy memory cells since they are also typically located near the drain-end and source-end of the NAND strings.

The drain-end can be considered to be a first end of a NAND string while the source-end is a second end, or the source-end can be considered to be a first end of a NAND string while the drain-end is a second end.

The Vth distribution 812 is significantly wider than the Vth distribution 810 and extends both below and above the Vth distribution 810. This variation represents a variation in the occurrence of the Vth-increasing phenomenon caused by the erase bias. For some select gate transistors, the erase bias reduces the Vth as expected in a normal erase operation. However, for other select gate transistors, the erase bias increases the Vth due to the phenomenon. See also FIG. 9A-9C. Tests show that the increase in the Vth is permanent and irreversible. For example, applying a gentle erase bias to the select gate transistors and baking the memory chip did not reverse the increase in the Vth.

A portion 812a of the Vth distribution 812 represents select gate transistors which pass a verify test relative to Vverify. These select gate transistors have a Vth>Vverify. In one approach, if a minimum number of the select gate transistors pass the verify test, e.g., perhaps 1-15% of the select gate transistors in a block or portion of a block, the disable operation is successfully completed. The minimum number is a bit ignore number.

In an example implementation, the operation irreversibly increases threshold voltages of at least a minimum number of the select gate transistors by at least 2 V. For example, the Vth of a select gate transistor may increase from 2-4 V to 4-6 V or higher.

Figure 9A:
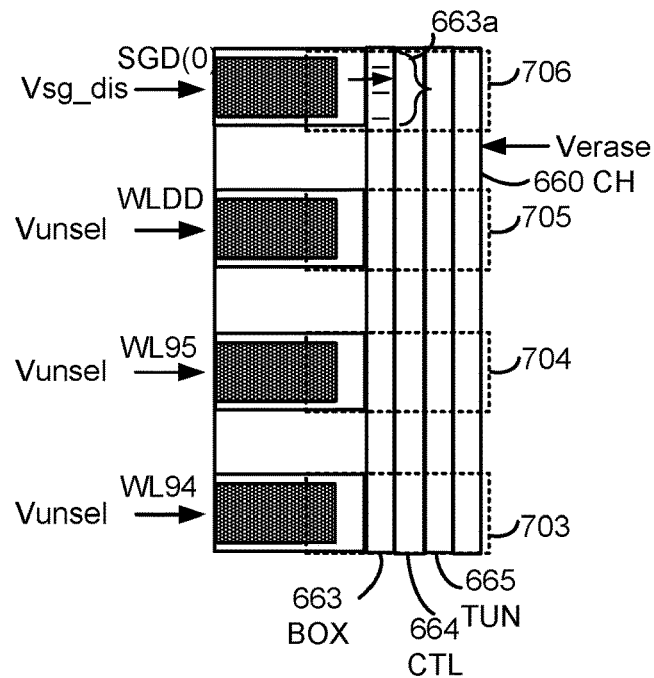
FIG. 9A depicts a portion of the NAND string 700*n* of FIG. 7A, showing an accumulation of electrons in the blocking oxide (BOX) 663, after a disable operation.

FIG. 9A depicts a portion of the NAND string 700n of FIG. 7A, showing an accumulation of electrons in the blocking oxide (BOX) 663, after a disable operation. The portion of the NAND string includes the data memory cells 703 and 704 and the associated word lines WL94 and WL95, respectively, the dummy memory cell 705 and the associated word line WLDD, and the select gate transistor 706 and the associate select gate line or control line SGD(0). The blocking oxide (BOX) layer 663, charge trapping layer (CTL) 664, tunnel oxide layer (TUN) 665 and channel (CH) 660 are also depicted. These layers extend continuously throughout the NAND string in this example, from the source end to the drain end. The materials provide a MANOS or metal (W)-aluminum oxide (Al2O3)-nitride (Si3N4)-oxide (SiO2)-silicon (Si) structure.

During the disable operation, an erase bias causes electrons (depicted by "-") to transition from the select gate line SGD(0) to a portion 663a of the blocking oxide layer associated with the select gate transistor 706, for example. The erase bias can be provided by applying an erase pulse, Verase, to the channel via the substrate, for example, to charge up (increase the voltage of) the channel to about 15-25 V, for example while a lower voltage Vsg_dis such as 0-5 V is applied to the select gate transistor. This provides a channel-to-gate voltage of at least 10, 15 or 20 V, for example, which can be sufficient to induce the above-mentioned phenomenon. In contrast, during a normal erase operation, the voltages of the select gate transistors may be floated or driven at a higher level, e.g., 10-15 V, which results in a lower channel-to-gate voltage, such that the above-mentioned phenomenon does not occur.

For memory cells, Vunsel=6-8 V is applied to the corresponding word lines. The memory cells typically do not have the defects mentioned above. This biasing of the memory cells can result in the Vth remaining relatively constant or in a lowering of the Vth of the memory cells.

Figure 9B:
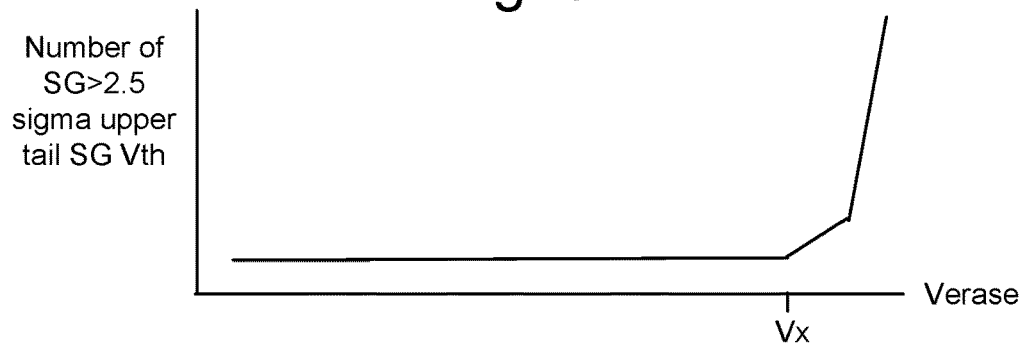
FIG. 9B depicts a plot of a number of select gate transistors having a high upper tail Vth versus an erase voltage, Verase.

FIG. 9B depicts a plot of a number of select gate transistors having a high upper tail Vth versus an erase voltage, Verase. The vertical axis depicts a number of select gate transistors whose Vth is higher than a 2.5 sigma level. A higher number represents a wider Vth distribution, such as the Vth distribution 812 of FIG. 8C. The erase bias increases as Verase increases. The number is relatively low when Verase<Vx, a transition voltage, so that the Vth distribution 811 of FIG. 8B is obtained. In contrast, the number increases sharply when Verase>Vx, so that the Vth distribution 812 of FIG. 8C is obtained. An appropriate value for Vx can be determined from tests.

Figure 9C:
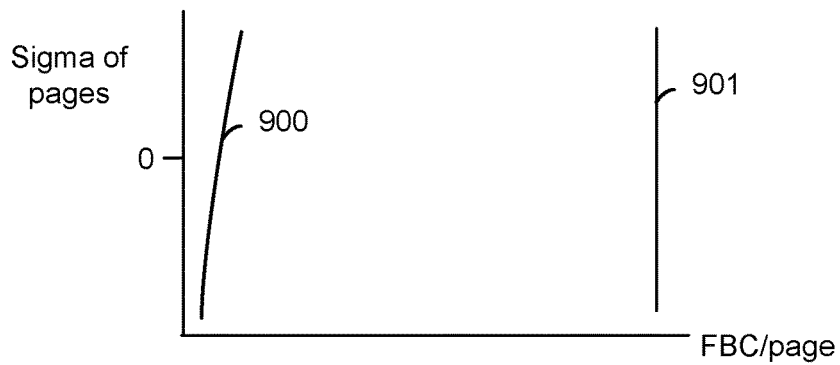
FIG. 9C depicts a plot of a sigma of pages versus a fail bit count per page.

FIG. 9C depicts a plot of a sigma of pages versus a fail bit count per page. A plot 900 represents a relatively low FBC in the case of normal erase, program and read operations. Different pages of data have different FBCs as represented by a distribution where sigma=0 is the midpoint. A plot 901 represents a very high FBC in the case of a disabling erase operation, demonstrating that data cannot be read from the memory cells once the operation is completed. In particular, when the Vth of the select gate transistors is higher than the highest available control gate voltage which can be applied to the select gate transistors using the on-chip power supply, the select gate transistors will remain in a non-conductive state so that the Vth of the memory cells cannot be read.

Figure 10A:
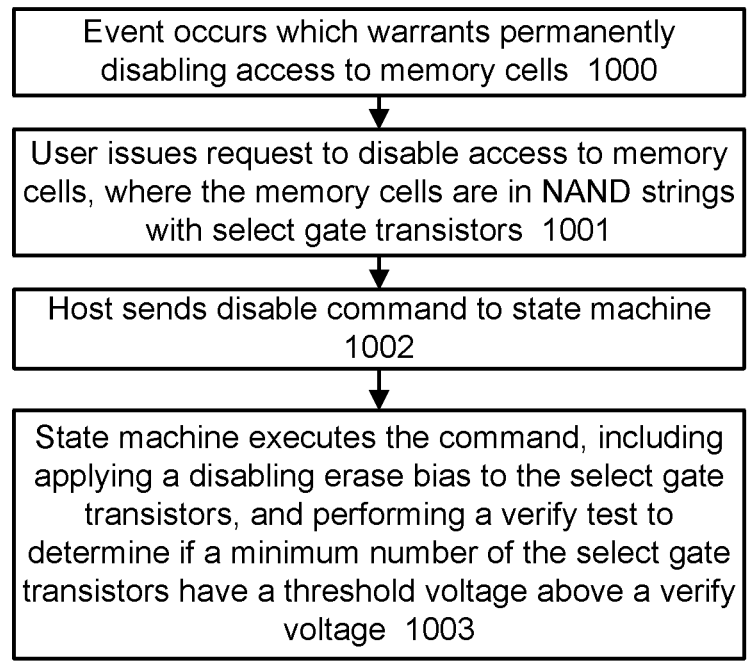
FIG. 10A depicts an overview of a process for permanently preventing access to memory cells.

FIG. 10A depicts an overview of a process for permanently preventing access to memory cells. At step 1000, an event occurs which warrants permanently disabling access to memory cells in a device. For example, the event can be a user losing the memory device, or the memory device no longer being needed. At step 1001, a user issues a request to disable access to the memory cells, where the memory cells are in NAND strings with select gate transistors. For example, the user could access an interface of a host device which communicates with the memory device. In another approach, the request is issued automatically, in a self-destruct mode, such as when a memory device cannot communicate with a host device for a period of time. At step 1002, the host device sends a disable command to a state machine or other circuit associated with the memory device. At step 1003, the state machine executes the command, including applying a disabling erase bias to the select gate transistors, and performing a verify test to determine if a minimum number of the select gate transistors have a threshold voltage above a verify voltage. This step can be performed in each erase-verify iteration of one or more erase-verify iterations until the verify test is passed. In another option, the erase bias is applied one or more times and not followed by an associated verify test.

A dedicated command can be provided which allows the user to easily and quickly trigger the disable operation. Corresponding parameters can also be provided, including:

F_Vera: initial magnitude of erase voltage. This can be higher than the initial erase voltage of a normal erase operation.

F_DVera: step size for incrementing the erase voltage magnitude in successive erase-verify iterations.

F_NTME: Erase pulse duration. This can be longer than the erase pulse duration of a normal erase operation. Moreover, the erase pulse width may be longer when the disable operation involves many, or all, blocks on a die since it can take relatively longer to charge up the channels of the NAND strings in a relatively larger number of blocks.

F_delta_NTME: step size for incrementing the erase voltage duration in successive erase-verify iterations.

F_Vverify: Erase-verify voltage.

F_BSPF: Bit ignore number for a verify test.

The "F" prefix denotes the disable operation. Similar parameters can be provided for a normal erase operation.

Commands can be issued by the off-chip controller 122 to the on-chip control circuitry 110 including the state machine 112 in connection with a disable operation, for example. The on-chip control circuitry 110 including the state machine 112 can execute the commands to perform the disable operation and report back to the controller 122 with a status of the operation.

In one approach, a control circuit (122, 130) is configured to connect to a plurality of memory cells (702-715, 722-735, 742-755, 762-775), where the plurality of memory cells are arranged in NAND strings (700n-700n15, 710n-710n15, 720n-720n15 or 730n-730n15), and the NAND strings comprise select gate transistors (701, 716, 721, 736, 741, 756, 761, 776). Further, a memory interface (122d, 131) is connected to the circuit, and the circuit is configured to issue a command via the memory interface to perform an operation which irreversibly increases threshold voltages of the select gate transistors above a verify voltage, wherein the operation applies a channel-to-gate voltage to the select gate transistors.

Figure 10B:
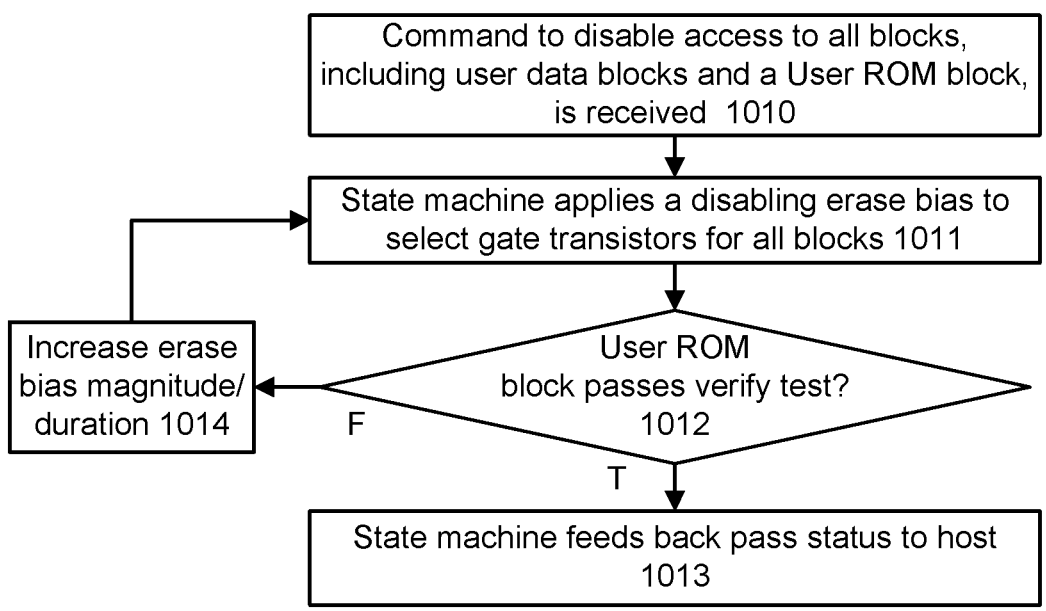
FIG. 10B depicts a process for permanently preventing access to a plurality of blocks of memory cells, consistent with FIG. 10A.

FIG. 10B depicts a process for permanently preventing access to a plurality of blocks of memory cells, consistent with FIG. 10A. At step 1010, a command is received to disable access to all blocks, including user data blocks and a ROM block, in a memory die or device. For example, the command can be received at a state machine from a host. At step 1011, the state machine applies a disabling erase bias to the select gate transistors for all blocks. A decision step 1012 determines whether the User ROM block passes the verify test. If the decision step is true, the state machine feeds back a pass status to the host at step 1013. If the decision step 1012 is false, step 1014 increases the erase bias magnitude and/or duration for a next erase-verify iteration. As mentioned, the verify test can be performed on a selected block in the set of blocks which are subject to the disable operation. The disabling of all blocks on a die is appropriate, e.g., when all blocks potentially contain sensitive data which should not be disclosed.

Figure 10C:
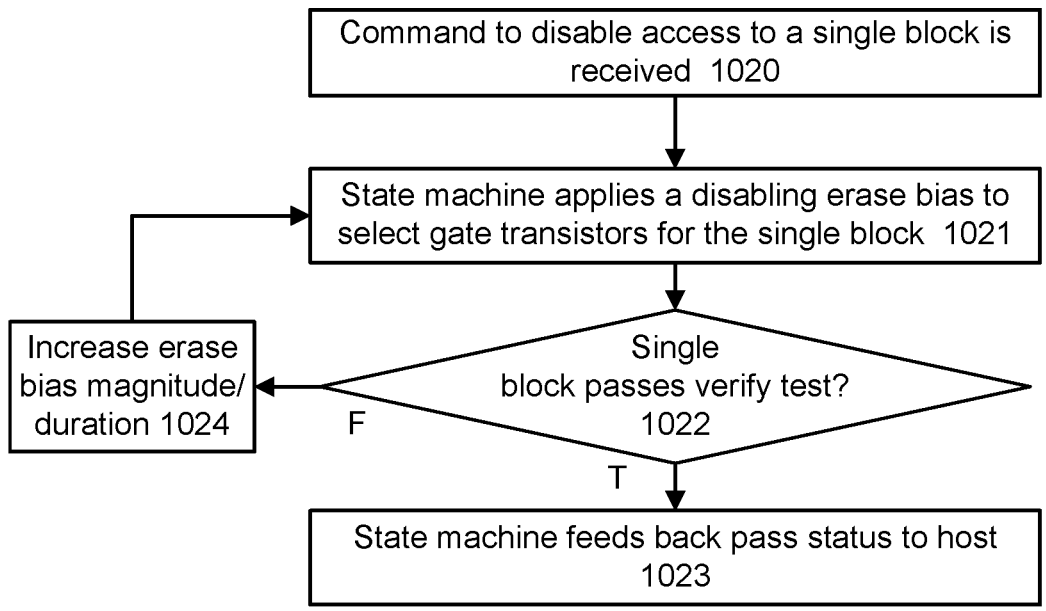
FIG. 10C depicts a process for permanently preventing access to a single block of memory cells, consistent with FIG. 10A.

FIG. 10C depicts a process for permanently preventing access to a single block of memory cells, consistent with FIG. 10A. At step 1020, a command to disable access to a single block is received. At step 1021, the state machine applies a disabling erase bias to the select gate transistors for the single block. A decision step 1022 determines whether the single block passes the verify test. If the decision step is true, the state machine feeds back a pass status to the host at step 1023. If the decision step 1022 is false, step 1024 increases the erase bias magnitude and/or duration for a next erase-verify iteration. The disabling of a single block is appropriate, e.g., when a particular block contains sensitive data which should not be disclosed. Multiple single block disabling operations can be performed to disable multiple blocks. It is also possible to concurrently disable a subset of all blocks on a die.

Figure 10D:
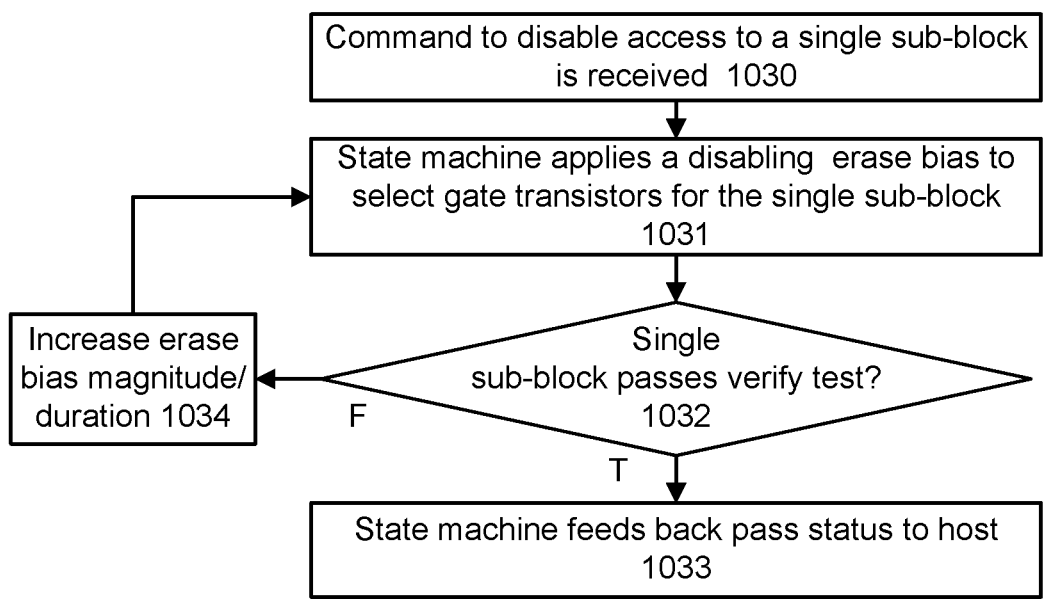
FIG. 10D depicts a process for permanently preventing access to a single sub-block of memory cells, consistent with FIG. 10A.

FIG. 10D depicts a process for permanently preventing access to a single sub-block of memory cells, consistent with FIG. 10A. At step 1030, a command to disable access to a single sub-block is received. At step 1031, the state machine applies a disabling erase bias to the select gate transistors for the single sub-block. A decision step 1032 determines whether the single sub-block passes the verify test. If the decision step is true, the state machine feeds back a pass status to the host at step 1033. If the decision step 1032 is false, step 1034 increases the erase bias magnitude and/or duration for a next erase-verify iteration. The disabling of a single sub-block is appropriate, e.g., when a particular sub-block contains sensitive data which should not be disclosed. Multiple single sub-block disabling operations can be performed to disable multiple sub-blocks in a block. It is also possible to concurrently disable multiple sub-blocks of a block.

The verify test could potentially be omitted in FIG. 10B-10D, for example, if the magnitude and duration of the erase bias is known to be sufficient to complete the disable operation.

FIG. 11A depicts a process for applying an erase bias to select gate transistors, consistent with FIG. 10A, step 1003. The SGD and SGS transistors both control access to the memory cells in a NAND string. If either type of transistor is subject to the disable operation, the memory cells cannot be accessed. Accordingly, in one implementation of the disable operation, both the SGD or SGS transistors are disabled. In another implementation of the disable operation, the SGD or SGS transistors, but not both, are disabled. A select gate transistor which is not disabled can receive a same voltage, Vunsel, as the memory cells in the disable operation.

Step 1100 begins a process to apply a disabling erase bias to the select gate transistors. These transistors are associated with a set of memory cells for which access is being disabled. Step 1101 includes applying Verase to the substrate to charge up the channels of the NAND strings to ~Verase (approximately Verase). Step 1102 includes applying a control gate voltage Vsg_dis<Verase to the select gate transistors. The magnitude of the erase bias which is appropriate for carrying out the disable operation can be determined from tests on a particular memory device. Step 1103 comprises applying a control gate voltage Vunsel<Verase to the memory cells. The memory cells need not be erased in the disable operation of the select gate transistors. Optionally, the memory cells are at least partially erased in the disable operation.

Steps 1101 and 1102 can be concurrent. Steps 1101-1103 can also be concurrent.

FIG. 11B depicts a process for performing a verify test for select gate transistors, consistent with FIG. 10A, step 1003 and FIG. 11A. Step 1110 begins a verify test for the select gate transistors. Step 1111 includes applying Vverify to the select gate transistors. Step 1112 includes applying Vread to the memory cells. This provides the memory cells in a conductive state to allow sensing of the Vth of the select gate transistors. Step 1113 includes sensing currents in the NAND strings. Steps 1111 and 1112 can be concurrent. Steps 1111-1113 can also be concurrent.

A SGD transistor is an example of a first select gate transistor and a SGS transistor is an example of a second select gate transistor. Or, a SGS transistor is an example of a first select gate transistor and a SGD transistor is an example of a second select gate transistor.

In one approach, the erase bias is applied concurrently to the SGD and SGS transistors. In another approach, the erase bias is applied separately to the SGD and SGS transistors, e.g., using separate erase pulses.

As noted by the Vth distribution 812 of FIG. 8C, a portion of the select gate transistors will have their Vth increase to a level which is greater than Vverify as a result of the disable operation. Some select gate transistors will have their Vth decrease as a result of the disable operation.

Figure 12B:
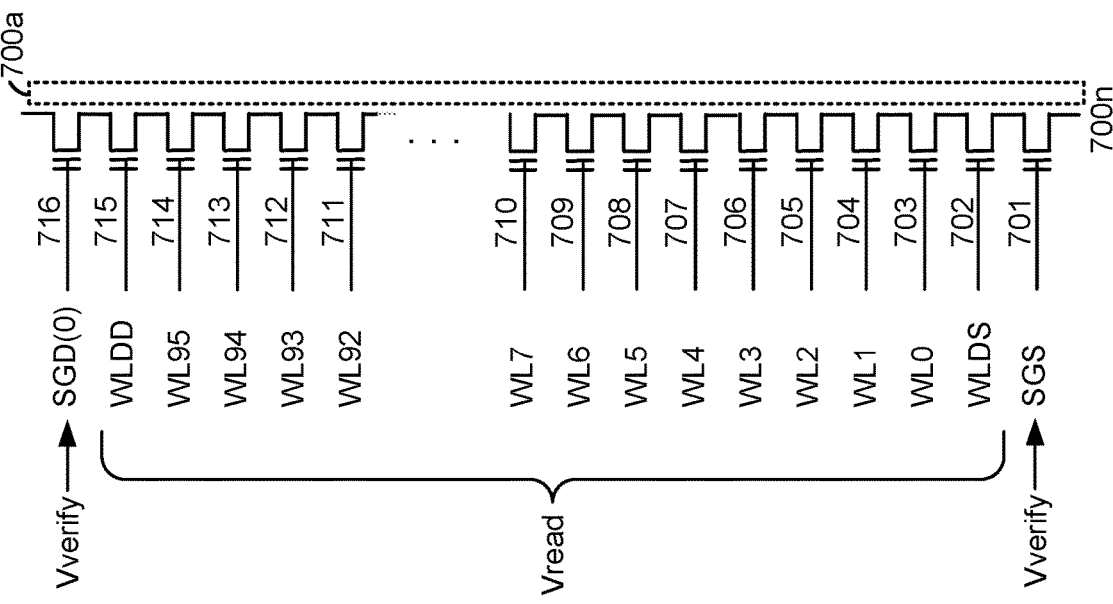
FIG. 12B depicts example voltages applied to the NAND string 700*n* of FIG. 7A, consistent with the process of FIG. 11B, where a verify voltage is applied to the SGD transistor 716 and the SGS transistor 701.
Figure 12A:
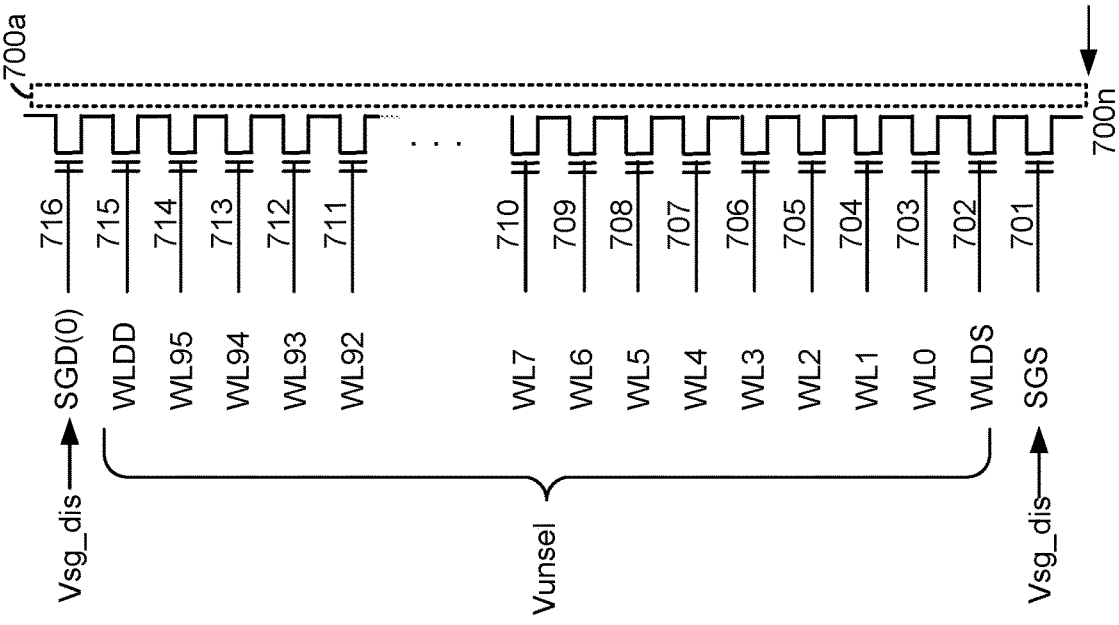
FIG. 12A depicts example voltages applied to the NAND string 700*n* of FIG. 7A, consistent with the process of FIG. 11A, where a disabling erase bias is applied to the SGD transistor 716 and the SGS transistor 701.

FIG. 12A depicts example voltages applied to the NAND string 700n of FIG. 7A, consistent with the process of FIG. 11A, where a disabling erase bias is applied to the SGD transistor 716 and the SGS transistor 701. To apply the erase bias, which is a channel-to-gate bias, a control gate voltage Vsg_dis, e.g., 0-5 V is applied to the SGD transistor 716 and the SGS transistor 701 while an erase voltage Verase, e.g., 15-25 V, is applied to the channel of the NAND string via the substrate, for example. The memory cells, including the dummy memory cells 702 and 715 and the data memory cells 703-714, receive a voltage Vunsel, e.g., 6-8 V.

FIG. 12B depicts example voltages applied to the NAND string 700n of FIG. 7A, consistent with the process of FIG. 11B, where a verify voltage is applied to the SGD transistor 716 and the SGS transistor 701. After applying the erase bias to the SGD and SGS transistors as depicted in FIG. 12A, a verify test is performed to determine whether the erase bias caused the Vth of the SGD and/or SGS transistor to increase above Vverify. Vverify is applied to the SGD transistor 716 and the SGS transistor 701 while a read pass voltage, Vread, e.g., 8-10 V, is applied to the memory cells. Vread provides the memory cells in a strongly conductive state so that the Vth of the SGD and SGS transistors can be sensed.

Figure 12D:
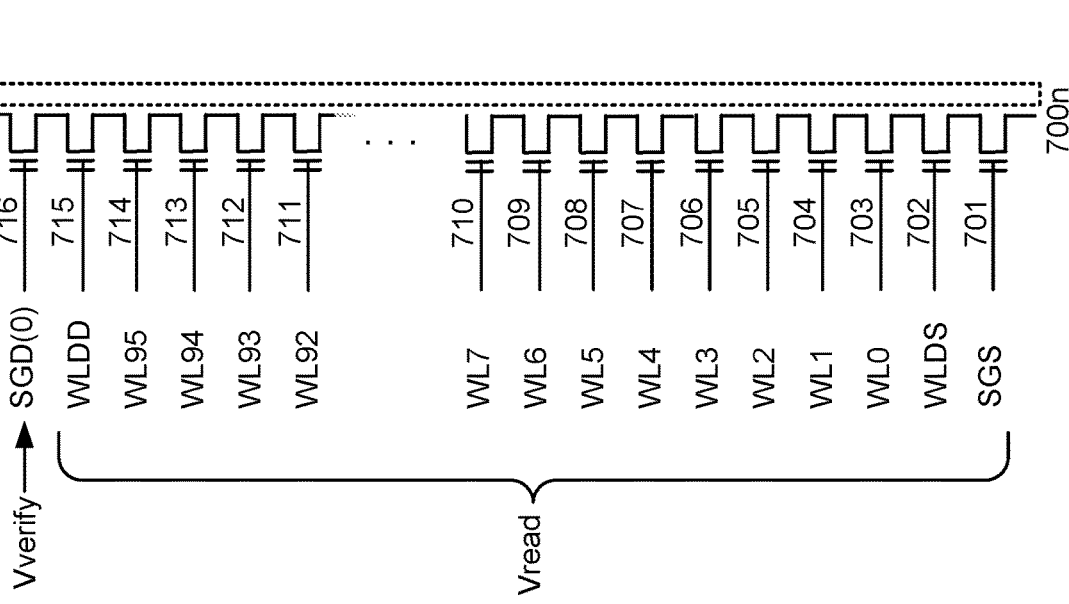
FIG. 12D depicts example voltages applied to the NAND string 700*n* of FIG. 7A, consistent with the process of FIG. 11B, where a verify voltage is applied to the SGD transistor 716 but not the SGS transistor 701.
Figure 12C:
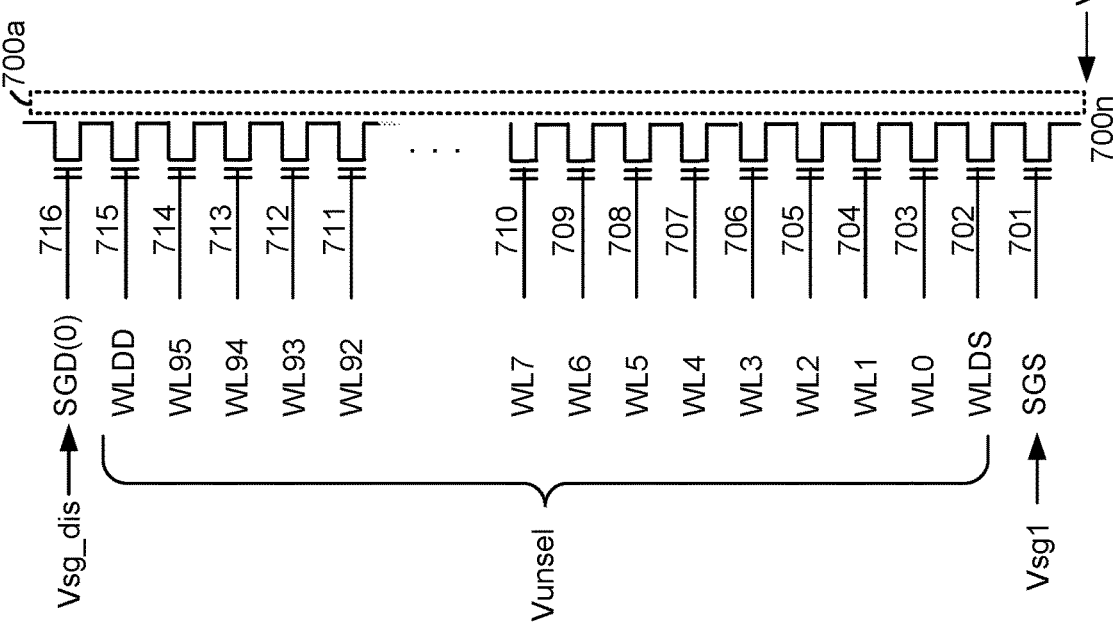
FIG. 12C depicts example voltages applied to the NAND string 700*n* of FIG. 7A, consistent with the process of FIG. 11A, where a disabling erase bias is applied to the SGD transistor 716 but not the SGS transistor 701.

FIG. 12C depicts example voltages applied to the NAND string 700n of FIG. 7A, consistent with the process of FIG. 11A, where a disabling erase bias is applied to the SGD transistor 716 but not the SGS transistor 701. As mentioned, it is possible to disable the SGD transistors but not the SGS transistors, as in this example, or to disable the SGS transistors but not the SGD transistors. Vsg_dis is applied to the SGD transistor 716 while a voltage Vsg1, e.g., 10-15 V, is applied to the SGS transistor 701. Vsg1>Vsg_dis.

In an option which disables the SGS transistors but not the SGD transistors, Vsg_dis is applied to the SGS transistor 701 while Vsg1 is applied to the SGD transistor 716.

FIG. 12D depicts example voltages applied to the NAND string 700n of FIG. 7A, consistent with the process of FIG. 11B, where a verify voltage is applied to the SGD transistor 716 but not the SGS transistor 701. After applying the erase bias to the SGD transistor as depicted in FIG. 12C, a verify test is performed to determine whether the erase bias caused the Vth of the SGD transistor to increase above Vverify. Vverify is applied to the SGD transistor 716 while a read pass voltage, Vread, e.g., 8-10 V, is applied to the memory cells and the SGS transistor 701.

In the option which disables the SGS transistors but not the SGD transistors, after applying the erase bias to the SGS transistor, a verify test is performed to determine whether the erase bias caused the Vth of the SGS transistor to increase above Vverify. Vverify is applied to the SGS transistor 701 while Vread is applied to the memory cells and the SGD transistor 716.

FIG. 13 depicts example waveforms in an operation consistent with the processes of FIGS. 11A and 11B. The vertical direction denotes voltage and the horizontal direction denotes a common time scale. Three erase-verify iterations, EV1-EV3, are depicted as an example, where the disable operation is completed after EV3. Generally, one or more erase-verify iterations may be used to complete the disable operation. EV1-EV3 are an example of one or more successive erase-verify iterations in the disable operation.

A voltage signal 1300 represents Verase, an erase voltage. This could be a voltage applied to a substrate and/or the bit lines of a block, for example. In the voltage signal, erase pulses 1301, 1302 and 1303 have magnitudes of Verase1, Verase2 and Verase3, respectively. Each erase pulse charges up the channels of the NAND strings in a block. The erase pulses may have a starting magnitude of, e.g., 15-25 V, and increase with each erase-verify iteration.

The voltage signal 1310 represents a voltage Vmem applied to the memory cells. During the erase pulses 1301, 1302 and 1303, Vmem is set to Vunse1, as depicted by plots 1311, 1313 and 1315, respectively. During the time periods between the erase pulses, Vmem is set to Vread as depicted by plots 1312, 1314 and 1316, to allow for sensing of the SGD transistors, in this example.

The voltage signal 1320 represents a voltage Vsg applied to the select gate transistors subject to the disabling erase operation. During the erase pulses 1301, 1302 and 1303, Vsg is set to Vsg_dis, as depicted by plots 1321, 1323 and 1325, respectively. During the time periods between the erase pulses, Vsg is set to Vverify as depicted by plots 1322, 1324 and 1326, to perform a verify test on the select gate transistors subject to the disabling erase operation.

The voltage signal 1330 represents a voltage Vsg applied to the select gate transistors which are not subject to the disabling erase operation. During the erase pulses 1301, 1302 and 1303, Vsg is set to Vsg1, as depicted by plots 1331, 1333 and 1335, respectively. During the time periods between the erase pulses, Vsg is set to Vread as depicted by plots 1332, 1334 and 1336 during the verify test on the select gate transistors subject to the disabling erase operation.

The voltage signal 1340 represents a voltage Vb1 of the bit lines. During the erase pulses 1301, 1302 and 1303, Vb1 is allowed to float, as depicted by plots 1341, 1343 and 1345, respectively. During the time periods between the erase pulses, Vb1 is set to a sensing voltage such as 0.5 V as depicted by plots 1342, 1344 and 1346, to sense the currents in the NAND strings.

When the disable operation is performed concurrently for a plurality of blocks, the voltage signals depicted can be applied concurrently to each block. For example, the disable operation can be performed concurrently for each of the blocks B0-0 to B0-3 and B0-4 to B0-7 on the memory die 400 of FIG. 4. When the disable operation is performed for a single block of a plurality of blocks, the voltage signals depicted can be applied to the single block. For example, the disable operation can be performed for a single block among the blocks B0-0 to B0-3 and B0-4 to B0-7 on the memory die 400 of FIG. 4. When the disable operation is performed for a single sub-block of a block, the voltage signals depicted can be applied to the single sub-block. For example, the disable operation can be performed for one of the sub-blocks SB0-SB3 of the block BLK0 of FIG. 7A. Since a separate Vsgd can be applied to each sub-block, the SGD transistors of one the sub-blocks which is the subject of the disable operation can receive the voltage signal 1320, while the SGD transistors of the remaining sub-blocks of the block which are not the subject of the disable operation can have a floating control gate voltage, consistent with the voltage signal 1340.

Accordingly, it can be seen that in one implementation, an apparatus comprises: a control circuit configured to connect to a plurality of memory cells, the plurality of memory cells are arranged in NAND strings, each NAND string comprising a first end and a second end, and a select gate transistor at the first end of the NAND string, and the circuit is configured to: perform an operation which prevents access to the plurality of memory cells, wherein to perform the operation, the control circuit is configured to apply an erase bias to the select gate transistors at the first end of the NAND strings and to determine whether threshold voltages of the select gate transistors at the first end of the NAND strings increase, in response to the erase bias, above a verify voltage.

In another implementation, a method comprises: applying an erase bias to a first select gate transistor in a NAND string in one or more erase-verify iterations of an operation; and determining in the one or more erase-verify iterations whether a threshold voltage of the first select gate transistor has increased above a verify voltage in response to the erase bias.

In another implementation, an apparatus comprises: a control circuit configured to connect to a plurality of memory cells, the plurality of memory cells are arranged in NAND strings, and the NAND strings comprise select gate transistors; and a memory interface connected to the circuit, the circuit is configured to issue a command via the memory interface to perform an operation which irreversibly increases threshold voltages of the select gate transistors above a verify voltage, wherein the operation applies a channel-to-gate voltage to the select gate transistors.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
a control circuit configured to connect to a plurality of memory cells, the plurality of memory cells are arranged in NAND strings, each NAND string comprising a first end and a second end, and a select gate transistor at the first end of the NAND string, and the control circuit is configured to:
perform an operation which prevents access to the plurality of memory cells, wherein to perform the operation, the control circuit is configured to apply an erase bias to the select gate transistors at the first end of the NAND strings and to determine whether threshold voltages of the select gate transistors at the first end of the NAND strings increase, in response to the erase bias, above a verify voltage, the verify voltage is greater than a highest programmed threshold voltage of the plurality of memory cells.

2. The apparatus of claim 1, wherein:
the determining whether the threshold voltages of the select gate transistors at the first end of the NAND strings increase, in response to the erase bias, above the verify voltage comprises determining whether a minimum number of the select gate transistors at the first end of the NAND strings have a threshold voltage above the verify voltage.

3. The apparatus of claim 1, wherein:
the applying of the erase bias and the determining whether the threshold voltages of the select gate transistors at the first end of the NAND strings increase, in response to the erase bias, above the verify voltage, are performed in one or more erase-verify iterations of the operation.

4. The apparatus of claim 1, wherein:
each NAND string comprises a select gate transistor at the second end of the NAND strings; and the control circuit is configured to apply an erase bias to the select gate transistors at the second end of the NAND strings in the operation.

5. The apparatus of claim 1, wherein:
to apply the erase bias to the select gate transistors at the first end of the NAND strings, the control circuit is configured to charge up channels of the NAND strings to an erase voltage while applying a control gate voltage to the select gate transistors at the first end of the NAND strings; and
the erase voltage exceeds the control gate voltage by at least 15 V.

6. The apparatus of claim 1, wherein:
the first end of the NAND strings is a drain end of the NAND strings.

7. The apparatus of claim 1, wherein:
the first end of the NAND strings is a source end of the NAND strings.

8. The apparatus of claim 1, wherein the control circuit is configured to:
apply the erase bias concurrently to select gate transistors at the first end of the NAND strings in a plurality of blocks; and
the determining whether the threshold voltages of the select gate transistors at the first end of the NAND strings increase, in response to the erase bias, above the verify voltage, comprises determining whether a minimum number of the select gate transistors at the first end of the NAND strings in one selected block of the plurality of blocks have a threshold voltage above the verify voltage.

9. The apparatus of claim 8, wherein:
the one selected block is a User ROM block; and
remaining blocks of the plurality of blocks comprise user data blocks.

10. The apparatus of claim 1, wherein:
the control circuit is configured to apply the erase bias concurrently to select gate transistors at the first end of the NAND strings in a single block; and
the determining whether the threshold voltages of the select gate transistors at the first end of the NAND strings increase, in response to the erase bias, above the verify voltage, comprises determining whether a minimum number of the select gate transistors at the first end of the NAND strings in the single block have a threshold voltage above the verify voltage.

11. The apparatus of claim 1, wherein:
the control circuit is configured to apply the erase bias concurrently to select gate transistors at the first end of the NAND strings in a single sub-block of a block; and
the determining whether the threshold voltages of the select gate transistors at the first end of the NAND strings increase, in response to the erase bias, above the verify voltage, comprises determining whether a minimum number of the select gate transistors at the first end of the NAND strings in the single sub-block of the block have a threshold voltage above the verify voltage.

12. The apparatus of claim 1, wherein:
the operation irreversibly increases threshold voltages of at least a minimum number of the select gate transistors by at least 2 V.

13. A method, comprising:
applying an erase bias to a first select gate transistor in a NAND string in one or more erase-verify iterations of an operation, the applying of the erase bias irreversibly increases a threshold voltage of the select gate transistor by at least 2 V; and
determining in the one or more erase-verify iterations whether a threshold voltage of the first select gate transistor has increased above a verify voltage in response to the erase bias.

14. The method of claim 13, further comprising:
applying an erase bias to a second select gate transistor in a NAND string in the one or more erase-verify iterations, wherein the first select gate transistor is at a first end of the NAND string and the second select gate transistor is at a second end of the NAND string.

15. An apparatus, comprising:
a control circuit configured to connect to a plurality of memory cells, the plurality of memory cells are arranged in NAND strings, and the NAND strings comprise select gate transistors; and
a memory interface connected to the control circuit, the control circuit is configured to issue a command via the memory interface to perform an operation which irreversibly increases threshold voltages of the select gate transistors above a verify voltage, wherein the operation applies a channel-to-gate voltage to the select gate transistors of at least 15 V.

16. The apparatus of claim 15, wherein:
the NAND strings extend vertically in a stack; and
the select gate transistors are at a top of the stack.

17. The apparatus of claim 15, wherein:
the NAND strings extend vertically in a stack; and
the select gate transistors are at a bottom of the stack.

* * * * *